(12) United States Patent
Maekawa et al.

(10) Patent No.: US 11,373,906 B2
(45) Date of Patent: Jun. 28, 2022

(54) THROUGH ELECTRODE SUBSTRATE, METHOD OF MANUFACTURING THROUGH ELECTRODE SUBSTRATE, AND MOUNTING SUBSTRATE

(71) Applicant: DAI NIPPON PRINTING CO., LTD., Tokyo-to (JP)

(72) Inventors: Shinji Maekawa, Tokyo-to (JP); Hiroshi Kudo, Tokyo-to (JP); Takamasa Takano, Tokyo-to (JP); Hiroshi Mawatari, Tokyo-to (JP); Masaaki Asano, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/178,659

(22) Filed: Feb. 18, 2021

(65) Prior Publication Data

US 2021/0175121 A1    Jun. 10, 2021

Related U.S. Application Data

(62) Division of application No. 16/325,911, filed as application No. PCT/JP2017/029819 on Aug. 21, 2017, now Pat. No. 10,957,592.

(30) Foreign Application Priority Data

Aug. 31, 2016   (JP) ................................. 2016-170015

(51) Int. Cl.
*H01L 23/48*    (2006.01)
*H01L 23/52*    (2006.01)
(Continued)

(52) U.S. Cl.
CPC .... *H01L 21/76898* (2013.01); *H01L 21/3205* (2013.01); *H01L 21/768* (2013.01);
(Continued)

(58) Field of Classification Search
CPC ........... H01L 21/76898; H01L 21/3205; H01L 21/768; H01L 21/76831; H01L 23/12;
(Continued)

(56) References Cited

U.S. PATENT DOCUMENTS

2006/0192286 A1    8/2006  Kanamura
2008/0006945 A1    1/2008  Lin et al.
(Continued)

FOREIGN PATENT DOCUMENTS

JP    2001-036253 A    2/2001
JP    2010-258320 A    11/2010
(Continued)

OTHER PUBLICATIONS

Nov. 14, 2017 International Search Report issued in International Patent Application No. PCT/JP2017/029819.
(Continued)

*Primary Examiner* — Theresa T Doan
(74) *Attorney, Agent, or Firm* — Oliff PLC

(57) ABSTRACT

A method of manufacturing a through electrode substrate, the method includes: preparing a substrate including a first surface positioned on a first side, and a second surface positioned on a second side opposite to the first side, the substrate being provided with a through hole; forming a through electrode having a sidewall portion extending along a sidewall of the through hole, and a first portion positioned on the first surface of the substrate and connected to the sidewall portion; forming an organic film inside the through hole; forming an inorganic film at least partially covering the first portion of the through electrode from the first side; forming an insulation layer positioned to the first side of the inorganic film; and forming an electroconductive layer passing through the inorganic film and the insulation layer so as to be connected to the first portion of the through electrode.

12 Claims, 23 Drawing Sheets

(51) Int. Cl.
*H01L 29/40* (2006.01)
*H01L 21/768* (2006.01)
*H01L 21/3205* (2006.01)
*H01L 23/13* (2006.01)
*H01L 23/14* (2006.01)
*H01L 23/532* (2006.01)
*H05K 1/11* (2006.01)
*H01L 23/522* (2006.01)
*H01L 23/12* (2006.01)
*H05K 3/40* (2006.01)

(52) U.S. Cl.
CPC ........ *H01L 21/76831* (2013.01); *H01L 23/12* (2013.01); *H01L 23/13* (2013.01); *H01L 23/14* (2013.01); *H01L 23/481* (2013.01); *H01L 23/522* (2013.01); *H01L 23/53209* (2013.01); *H05K 1/11* (2013.01); *H05K 3/40* (2013.01)

(58) Field of Classification Search
CPC ....... H01L 23/13; H01L 23/14; H01L 23/481; H01L 23/522; H01L 23/53209; H01L 21/4857; H01L 23/15; H01L 23/49822; H01L 23/49827; H05K 1/11; H05K 3/40
USPC ........................................................ 257/774
See application file for complete search history.

(56) References Cited

U.S. PATENT DOCUMENTS

| 2009/0236130 | A1* | 9/2009 | Mok | ............... H05K 3/4608 174/257 |
| 2011/0061905 | A1* | 3/2011 | Hwang | ............... H05K 3/10 29/830 |
| 2014/0318834 | A1 | 10/2014 | Tsuchida | |

FOREIGN PATENT DOCUMENTS

| JP | 2014-168007 A | 9/2014 |
| TW | 201613050 A | 4/2016 |
| WO | 2014/069662 A1 | 5/2014 |

OTHER PUBLICATIONS

Mar. 5, 2019 International Preliminary Report on Patentability issued in International Patent Application No. PCT/JP2017/029819.
Apr. 13, 2020 Taiwanese Office Action issued in Taiwanese Patent Application No. 106128262.
Dec. 24, 2021 Office Action issued in Japanese Patent Application No. 2018-537143.

* cited by examiner

110

120

130

140

150

160

170

180

THROUGH ELECTRODE SUBSTRATE, METHOD OF MANUFACTURING THROUGH ELECTRODE SUBSTRATE, AND MOUNTING SUBSTRATE

CROSS REFERENCE TO RELATED APPLICATIONS

This is a Division of U.S. application Ser. No. 16/325,911 filed May 22, 2019, which in turn is a national stage of PCT/JP2017/029819 filed Aug. 21, 2017, which claims priority to JP 2016-170015 filed Aug. 31, 2016. The disclosure of each of the prior applications is hereby incorporated by reference herein in its entirety.

FIELD OF THE INVENTION

The embodiment of the disclosure relates to a through electrode substrate and a method of manufacturing a through electrode substrate. In addition, the embodiment of the disclosure relates to a mounting substrate comprising the through electrode substrate.

BACKGROUND ART

A member so-called through electrode substrate, which includes a substrate having a first surface and a second surface, a plurality of through holes provided in the substrate, and an electrode provided inside each through hole is widely used. For example, a through electrode substrate is used as an interposer interposed between two LSI chips, when a plurality of LSI chips are stacked in order to increase a packaging density of an LSI. In addition, a through electrode substrate is sometimes interposed between an element such as an LSI chip and a mounting substrate such as a motherboard. In the following description, an electrode provided inside a through hole is sometimes referred to as "through electrode".

The through electrode substrate includes a plurality of wiring layers stacked on a through electrode. Each wiring layer has an electroconductive layer and an insulation layer positioned between electroconductive layers of respective wiring layers. As disclosed in Patent Document 1, for example, an organic material such as polyimide is used as a material for forming an insulation layer. A metal material such as copper is used as a material for forming an electroconductive layer. A step of forming an electroconductive layer includes a step of forming copper by plating, a step of annealing the copper formed by plating, and so on.

Patent Document 1: WO2014/69662

DISCLOSURE OF THE INVENTION

When a through electrode substrate is manufactured, a substrate and a through electrode are repeatedly exposed to a high temperature, e.g., a temperature of not less than 200° C., in an organic-material baking step, a copper annealing step, etc. On the other hand, a coefficient of thermal expansion of a metal material, such as copper, forming a through electrode is generally larger than a coefficient of thermal expansion of an inorganic material, such as glass or silicon, forming a substrate. Thus, each time when a temperature rises, it is considered that a through electrode thermally expands greatly as compared with a substrate, so that an electroconductive layer of a wiring layer connected to a through electrode is subjected to stress. When the electroconductive layer of the wiring layer is repeatedly subjected to stress, a defect may occur at a position where a plurality of electroconductive layers of wiring layers are connected to one another, resulting in connection failure between the electroconductive layers.

The embodiment of the disclosure has been made in view of such a point. The object thereof is to provide a through electrode substrate capable of preventing generation of connection failure.

One embodiment of the disclosure is:

a through electrode substrate comprising:

a substrate including a first surface positioned on a first side, and a second surface positioned on a second side opposite to the first side, the substrate being provided with a through hole;

a through electrode having a sidewall portion extending along a sidewall of the through hole, and a first portion positioned on the first surface of the substrate and connected to the sidewall portion;

an organic film positioned inside the through hole;

an inorganic film that at least partially covers the first portion of the through electrode from the first side and is provided with an opening positioned on the first portion; and a first wiring layer having an insulation layer that is positioned to the first side of the inorganic film and includes at least an organic layer provided with an opening communicating with the opening of the inorganic film, and an electroconductive layer connected to the first portion of the through electrode through the opening of the inorganic film and the opening of the insulation layer.

In the through electrode substrate according to the one embodiment of the disclosure, the inorganic film may at least partially cover the sidewall portion of the through electrode.

In the through electrode substrate according to the one embodiment of the disclosure, the through electrode may further have a second portion positioned on the second surface of the substrate and connected to the sidewall portion; and the inorganic film may at least partially cover the second portion of the through electrode from the second side.

In the through electrode substrate according to the one embodiment of the disclosure, the inorganic film may at least partially cover an end surface of the organic film on the first side.

In the through electrode substrate according to the one embodiment of the disclosure, the through electrode may further have a second portion positioned on the second surface of the substrate and connected to the sidewall portion; and the through electrode substrate may further comprise a second-surface-side inorganic film at least partially covering the second portion of the through electrode from the second side.

In the through electrode substrate according to the one embodiment of the disclosure, the second-surface-side inorganic film may at least partially cover an end surface of the organic film on the second side.

The through electrode according to the one embodiment of the disclosure may further comprise a second wiring layer having an insulation layer provided with an opening positioned on the electroconductive layer of the first wiring layer, and an electroconductive layer connected to the electroconductive layer of the first wiring layer through the opening of the insulation layer; and the insulation layer of the second wiring layer may include an inorganic layer at least partially covering the electroconductive layer of the first wiring layer from the first side.

The through electrode according to the one embodiment of the disclosure may further comprise a second wiring structure including at least a first wiring layer positioned on the second surface of the substrate; the through electrode may further have a second portion positioned on the second surface of the substrate and connected to the sidewall portion; and the first wiring layer of the second wiring structure may have an insulation layer provided with an opening positioned on the second portion of the through electrode, and an electroconductive layer connected to the second portion of the through electrode through the opening of the insulation layer.

The number of electroconductive layers included in the second wiring structure may be smaller than the number of electroconductive layers positioned on the first side of the substrate. In this case, the organic layer of the first wiring layer of the second wiring structure may include a portion that is not covered with an inorganic layer having insulation properties. In addition, the inorganic film partially may cover the sidewall portion such that the inorganic film does not extend up to an end portion on the second side of the sidewall portion of the through electrode. In addition, an end surface of the organic film on the second side at least partially may include a portion that is not covered with an inorganic film having insulation properties.

In the through electrode substrate according to the one embodiment of the disclosure, the inorganic film may include at least silicon oxide or silicon nitride.

One embodiment of the disclosure is:
a method of manufacturing a through electrode substrate comprising:
a step of preparing a substrate including a first surface positioned on a first side, and a second surface positioned on a second side opposite to the first side, the substrate being provided with a through hole;
a step of forming a through electrode having a sidewall portion extending along a sidewall of the through hole, and a first portion positioned on the first surface of the substrate and connected to the sidewall portion;
a step of forming an organic film inside the through hole;
a step of forming an inorganic film at least partially covering the first portion of the through electrode from the first side;
a step of forming an insulation layer positioned to the first side of the inorganic film; and
a step of forming an electroconductive layer passing through the inorganic film and the insulation layer so as to be connected to the first portion of the through electrode.

In the manufacturing method of a through electrode substrate according to the one embodiment of the disclosure, the inorganic film may at least partially cover the sidewall portion of the thorough electrode.

In the manufacturing method of a through electrode substrate according to the one embodiment of the disclosure, the step of forming the through electrode may further form a second portion positioned on the second surface of the substrate and connected to the sidewall portion; and the inorganic film may at least partially cover the second portion of the through electrode from the second side.

In the manufacturing method of a through electrode substrate according to the one embodiment of the disclosure, the inorganic film may at least partially cover an end surface of the organic film on the first side.

In the manufacturing method of a through electrode substrate according to the one embodiment of the disclosure, the step of forming the through electrode may further form a second portion positioned on the second surface of the substrate and connected to the sidewall portion; and the method of manufacturing a through electrode substrate may further comprise a step of forming a second-surface-side inorganic film at least partially covering the second portion of the through electrode from the second side.

In the manufacturing method of a through electrode substrate according to the one embodiment of the disclosure, the second-surface-side inorganic film may at least partially cover an end surface of the organic film on the second side.

In the manufacturing method of a through electrode substrate according to the one embodiment of the disclosure, the inorganic film may include at least silicon oxide or silicon nitride.

One embodiment of the disclosure is:
a mounting substrate
a through electrode substrate; and
an element loaded on the through electrode substrate;
wherein the through electrode substrate comprises:
a substrate including a first surface positioned on a first side, and a second surface positioned on a second side opposite to the first side, the substrate being provided with a through hole;
a through electrode having a sidewall portion extending along a sidewall of the through hole, and a first portion positioned on the first surface of the substrate and connected to the sidewall portion;
an organic film positioned inside the through hole;
an inorganic film that at least partially covers the first portion of the through electrode from the first side and is provided with an opening positioned on the first portion; and
a first wiring layer having an insulation layer that is positioned to the first side of the inorganic film and includes at least an organic layer provided with an opening communicating with the opening of the inorganic film, and an electroconductive layer connected to the first portion of the through electrode through the opening of the inorganic film and the opening of the insulation layer.

According to the through electrode substrate, generation of connection failure can be prevented.

DETAILED DESCRIPTION OF THE INVENTION

First Embodiment

Figure 1:
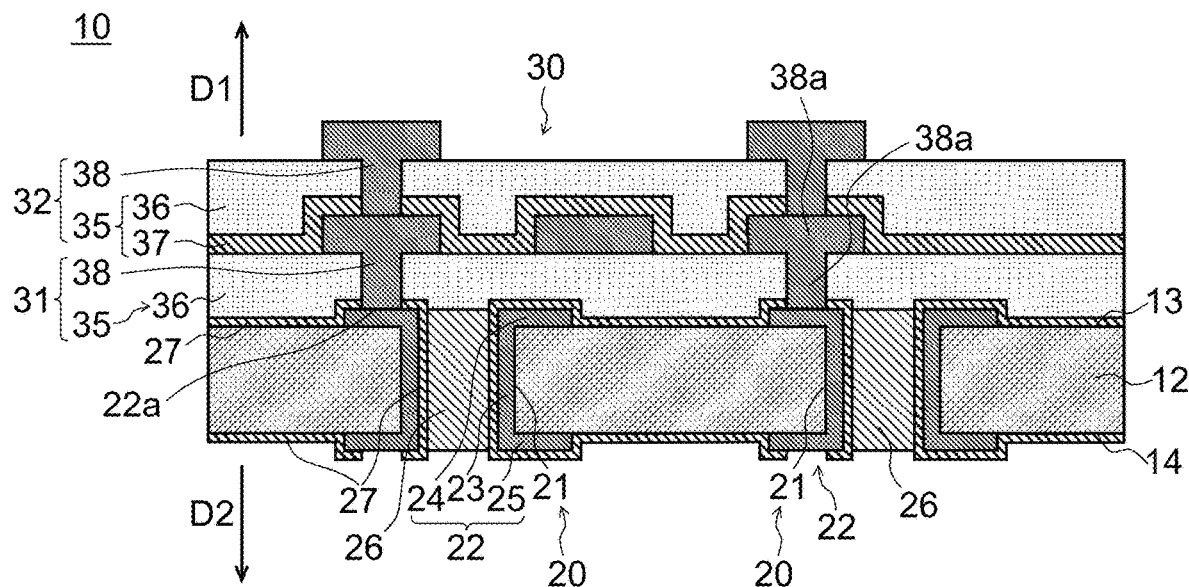
FIG. 1 is a sectional view showing a through electrode substrate according to a first embodiment.

A structure of a through electrode substrate according to the embodiment of the disclosure and a method of manufacturing the same are described in detail herebelow. The below embodiments are mere examples of the embodiments of the disclosure, and the disclosure should not be construed to be limited to these embodiments. In this specification, the terms "substrate", "base member", "sheet" and "film" are not differentiated from one another, based only on the difference in terms. For example, the "substrate" or the "base member" is a concept including a member that can be referred to as sheet or film. Further, terms specifying shapes, geometric conditions and their degrees, e.g., terms such as "parallel", "orthogonal", etc. and values of a length and an angle, etc., are not limited to their strict definitions, but should be construed to include a range capable of exerting a similar function. In addition, in the drawings referred in the embodiments, the same parts or parts having a similar function have the same reference number or similar reference number, and repeated description may be omitted. In addition, a scale size may be different from the actual one, for the convenience of easiness in illustration and understanding, and a part of a structure may be omitted from the drawings.

Through Electrode Substrate

Figure 2:
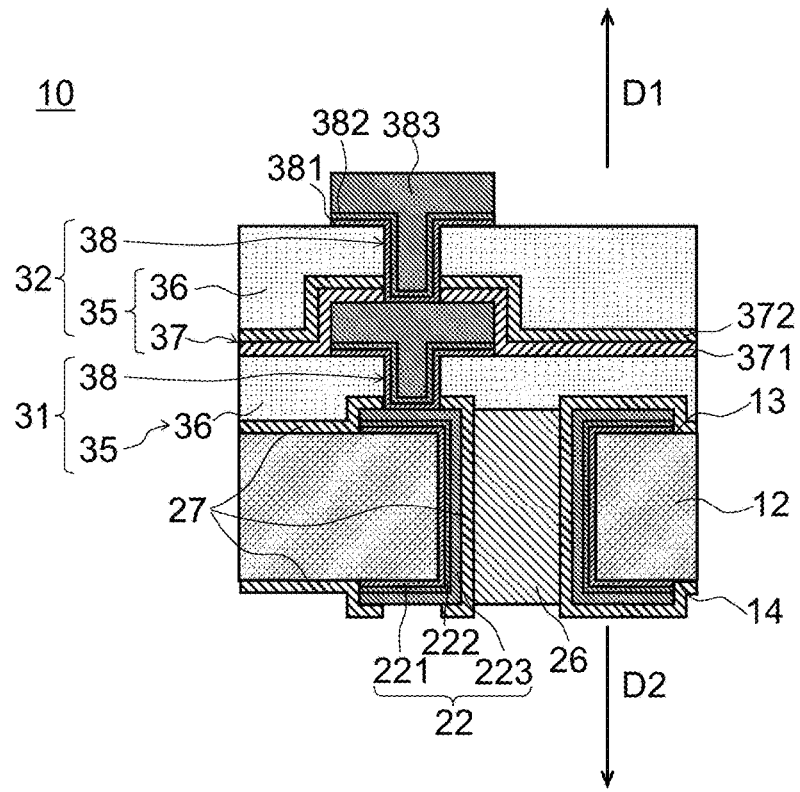
FIG. 2 is an enlarged sectional view of the through electrode substrate of FIG. 1.

Embodiments of the disclosure are described hereinbelow. Firstly, a structure of a through electrode substrate 10 according to an embodiment is described with reference to FIGS. 1 and 2. FIG. 1 is a sectional view showing the through electrode substrate 10. FIG. 2 is an enlarged sectional view showing the through electrode substrate 10 of FIG. 1.

The through electrode substrate 10 comprises a substrate 12, a through electrode 22, an organic film 26, an inorganic film 27, and a first wiring structure 30. The respective constituent elements of the through electrode substrate 10 are described below.

(Substrate)

The substrate 12 includes a first surface 13 positioned on a first side D1, and a second surface 14 positioned on a second side D2 opposite to the first side D1. In addition, the substrate 12 is provided with a plurality of through holes 20 running from the first surface 13 to reach the second surface 14.

The substrate 12 is formed of an inorganic material having certain insulation properties. For example, the substrate 12 may be a glass substrate, a quartz substrate, a sapphire substrate, a resin substrate, a silicon substrate, a silicon carbide substrate, an alumina ($Al_2O_3$) substrate, an aluminum nitride (AlN) substrate, a zirconium oxide ($ZrO_2$) substrate and so on, or a substrate made by stacking these substrates. The substrate 12 may include a substrate formed of a material having electroconductive properties, such as an aluminum substrate, a stainless substrate and so on.

A thickness of the substrate 12 is not particularly limited, but the use of the substrate 12 having a thickness of not less than 100 µm and not more than 800 µm is preferred. More preferably, the substrate 12 has a thickness of not less than 200 µm and not more than 600 µm. When the substrate 12 has a thickness of not less than 100 µm, warp of the substrate 12 can be prevented from increasing. Thus, it can be prevented that handling of the substrate 12 during a manufacturing step becomes difficult, and that the substrate 12 is warped because of an internal stress of a membrane formed on the substrate 12. In addition, when the substrate 12 has a thickness of not more than 800 µm, it can be prevented that a period of time required for a step of forming the through holes 20 in the substrate 12 is elongated to increase a manufacturing cost of the through electrode substrate 10.

As shown in FIG. 1, a sidewall 21 of the through hole 20 may extend along a normal direction of the first surface 13 of the substrate 12. Alternatively, although not shown, the sidewall 21 may extend along a direction displaced from the normal direction of the first surface 13 of the substrate 12, or a part of the sidewall 21 may be curved.

(Through Electrode)

The through electrode 22 is a member at least partially positioned inside the through hole 20, and having electroconductive properties. In the embodiment of the disclosure, the through electrode 22 is formed such that a hollow part remains in the through hole 20. Namely, the through electrode 22 is a conformal via. The through electrode 22 includes at least a sidewall portion 23 and a first portion 24. The through electrode 22 may further include a second portion 25.

The sidewall portion 23 extends along the sidewall 21 of the through hole 20. The first portion 24 is connected to the sidewall portion 23 from the first side D1, and is provided on the first surface 13 of the substrate 12. The first portion 24 forms a first end surface 22a that is an end surface of the through electrode 22 on the first side D1. The second portion 25 is connected to the sidewall portion 23 from the second side D2, and is provided on the second surface 14 of the substrate 12. The second portion 25 forms a second end surface 22b of the through electrode 22 on the second side D2.

As long as the through electrode 22 has electroconductive properties, a method of forming the through electrode 22 is not particularly limited. For example, the through electrode 22 may be formed by a physical film deposition method such as a vapor deposition method or a sputtering method, or may be formed by a chemical film deposition method or a plating method. In addition, the through electrode 22 may be composed of a single layer having electroconductive properties, or may include a plurality of layers having electroconductive properties. Herein, as shown in FIG. 2, an example in which the through electrode 22 includes a barrier layer 221, a seed layer 222 and a plated layer 223, which are laminated in this order on a surface of the substrate 12, is described. The surface of the substrate 12 includes the first surface 13 of the substrate 12, the second surface 14 thereof, or the sidewall 21 of the through hole 20. The barrier layer 221 is positioned closest to the substrate 12.

The barrier layer 221 is a layer positioned between other constituent elements of the through electrode 22, such as the seed layer 222, the plated layer 223 or the like, and the surface of the substrate 12. The barrier layer 221 is provided according to need, in order to prevent that metal elements in the constituent elements of the through electrode 22, such as the seed layer 222, the plated layer 223, etc., diffuse inside the substrate 12. When the seed layer 222 or the plated layer 223 contains copper, as a material of the barrier layer 221, titanium, titanium nitride, molybdenum, molybdenum nitride, tantalum, tantalum nitride, etc., or stack of them may be used. In addition, as a material of the barrier layer 221, an electroconductive material having high adhesion properties to the substrate 12 can be used. For example, as a material of the barrier layer 221, titanium, molybdenum, tungsten, tantalum, nickel, chrome, aluminum, a compound of them, an alloy of them, or lamination of them may be used. A thickness of the barrier layer 221 is, for example, not less than 10 nm and not more than 1 µm. The barrier layer 221 is formed by, for example, a physical film deposition method such as a vapor deposition method or a sputtering method.

The seed layer 222 is a layer which has electroconductive properties, and serves as a base on which metal ions in a plating solution deposit to grow the plated layer 223, during an electrolytic plating step of forming the plated layer 223 by a plating process. As a material of the seed layer 222, the same metal material as that of the plated layer 223, such as copper, can be used. A thickness of the seed layer 222 is, for example, not less than 10 nm and not more than 3 µm. The seed layer 222 is formed by, for example, a physical film deposition method such as a vapor deposition method or a sputtering method.

Although not shown, a single layer capable of serving both the barrier layer and the seed layer may be provided between the surface of the substrate 12 and the plated layer 223.

The plated layer 223 is a layer having electroconductive properties, which is formed by a plating process. As a material forming the plated layer 223, a metal such as copper, gold, silver, platinum, rhodium, tin, aluminum, nickel and chrome, alloy of them, or lamination of them may be used.

(Organic Film)

The organic film 26 is positioned inside the through hole 2 at a position closer to the center side of the through hole 20 than the sidewall portion 23 of the through electrode 22. The "center side" means that, inside the through hole 20, a distance between the organic film 26 and the sidewall 21 is larger than a distance between the sidewall portion 23 and the sidewall 21. By providing the through hole 20 with the organic film 26, in other words, by filling the hollow part of the through hole 20 with the organic film 26, it can be prevented that a plating solution, an organic material and an inorganic material remain as residue inside the through hole 20. The through hole 20 may not be completely filled with the organic film 26. For example, a gap may present partially between the side wall portion 23 of the through electrode 22 and the organic film 26. In addition, a recess, which at least partially reaches to a position between the first surface 13 of the substrate 12 and the second surface 14, may be formed in an end surface of the organic film 26 on the first side D1. Similarly, a recess, which at least partially reaches to a position between the second surface 14 of the substrate 12 and the first surface 13, may be formed in an end surface of the organic film on the second side D2.

The organic film 26 is formed of an organic material having insulation properties. For example, the organic film 26 contains an organic material such as polyimide or benz cyclobutene.

(Inorganic Film)

The inorganic film 27 is a film that is formed of an inorganic material, and at least partially covers the first portion 24 of the through electrode 22 from the first side D1. The inorganic film 27 may further cover the sidewall portion 23 of the through electrode 22. In addition, the inorganic film 27 may further at least partially cover the second portion 25 of the through electrode 22 from the second side D2. In addition, the inorganic film 27 may further cover the first surface 13 and the second surface 14 of the substrate 12. In this embodiment, the inorganic film 27 includes a series of films positioned on the first surface 13 of the substrate 12, on the sidewall portion 23 of the through electrode 22, on the first portion 24 thereof, on the second portion 25 thereof, and on the second surface 14 of the substrate 12.

The inorganic film 27 positioned on the first portion 24 of the through electrode 22 is provided with an opening. Through this opening, a below-described electroconductive layer 38 of a first wiring layer 31 of the first wiring structure 30 is connected to the first portion 24 of the through electrode 22. Similarly, the inorganic film 27 positioned on the second portion 25 of the through electrode 22 may also be provided with an opening.

As an inorganic material of the inorganic film 27, silicon oxide such as $SiO_2$, and silicon nitride such as SiN may be used. Otherwise, SiOC, SiC, SiOF, SiON, SiCN may be used as an inorganic material of the inorganic film 27, for example. In addition, the inorganic film 27 may have a plurality of films containing an inorganic material. For example, the inorganic film 27 includes a first inorganic film and a second inorganic film laminated on the first inorganic film. Preferably, the first inorganic film has higher adhesion properties to a plated layer 383 of the electroconductive layer 38 than the second inorganic film. For example, the first inorganic film contains silicon nitride such as SiN, and the second inorganic film contains silicon oxide such as $SiO_2$. A thickness of the first inorganic film is, for example, not less than 0.05 µm and not more than 0.1 µm. A thickness of the second inorganic film is, for example, not less than 0.5 µm and not more than 3 µm. Preferably, the thickness of the first inorganic film is smaller than the thickness of the second inorganic film.

(First Wiring Structure)

As shown in FIG. 1, the first wiring structure 30 includes a first wiring layer 31 positioned to the first side D1 of the inorganic film 27, and a second wiring layer 32 positioned on the first wiring layer 31. Herebelow, structures of the first wiring layer 31 and the second wiring layer 32 are described.

[First Wiring Layer]

As shown in FIG. 1, the first wiring layer 31 has an insulation layer 35 and an electroconductive layer 38. The insulation layer 35 is provided with an opening that communicates with the opening of the inorganic film 27 positioned on the first portion 24 of the through electrode 22. The electroconductive layer 38 is connected to the first portion 24 of the through electrode 22 through the opening of the inorganic film 27 and the opening of the insulation layer 35. For example, as shown in FIG. 1, the electroconductive layer 38 includes a first portion 38a that is positioned inside the opening of the inorganic film 27 and the opening of the insulation layer 35 and is connected to the first portion 24 of the through electrode 22, and a second portion 38b that is positioned to the first side D1 of the insulation layer 35. A part of the second portion 38b is connected to the first portion 38a.

The insulation layer 35 of the first wiring layer 31 includes an organic layer 36 formed of an organic material having insulation properties. The organic layer 36 is in contact with an end surface of the organic film 26 on the first side D1. As an organic material of the organic layer 36, polyimide, epoxy, acryl and so on can be used, for example. A thickness of the insulation layer 35 is, for example, not less than 0.5 µm and not more than 10 µm.

As shown in FIG. 2, the electroconductive layer 38 may include a barrier layer 381, a seed layer 382 and a plated layer 383, which are arranged side by side in this order from the side of the sidewall of the opening of the insulation layer 35 to the center side of the opening. The functions and the structures of the barrier layer 381, the seed layer 382 and the plated layer 383 are the same as the functions and the structures of the barrier layer 221, the seed layer 22 and the plated layer 223 of the through electrode 22, which are described above.

[Second Wiring Layer]

Next, the second wiring layer 32 is described. Constituent elements of the second wiring layer 32, which are in common with the constituent elements of the first wiring layer 31, have the same reference numerals, and description thereof is omitted.

Similarly to the first wiring layer 31, the second wiring layer 32 has an insulation layer 35 and an electroconductive layer 38. The insulation layer 35 is provided with an opening positioned on the electroconductive layer 38 of the first wiring layer 31. The electroconductive layer 38 is connected to the electroconductive layer 38 of the first wiring layer 31 through the opening of the insulation layer 35.

The insulation layer 35 of the second wiring layer 32 has an inorganic layer 37 positioned on the insulation layer 35 and the electroconductive layer 38 of the first wiring layer 31, and an organic layer 36 positioned to the first side D1 of the inorganic layer 37. The inorganic layer 37 at least partially covers the second portion 38b of the electroconductive layer 38 of the first wiring layer 31. The term "cover" means that, when the through electrode substrate 10 is seen along the normal direction of the first surface 13 of the substrate 12, the inorganic layer 37 of the second wiring layer 32 and the second portion 38b of the electroconductive layer 38 of the first wiring layer 31 are at least partially overlapped.

The inorganic layer 37 is a layer formed of an inorganic material having insulation properties. As an inorganic material of the inorganic layer 37, silicon oxide such as $SiO_2$, and silicon nitride such as SiN may be used. Otherwise, SiOC, SIC, SiOF, SiON, SiCN may be used as an inorganic material of the inorganic layer 37, for example.

As shown in FIG. 2, the inorganic layer 37 may include a plurality of inorganic layers. For example, the inorganic layer 37 includes a first inorganic layer 371, and a second inorganic layer 372 positioned on the first side D1 of the inorganic layer 371. Preferably, the first inorganic layer 371 has higher adhesion properties to the plated layer 383 than the second inorganic layer 372. In addition, preferably, the second inorganic layer 372 has a lower relative dielectric constant than that of the first inorganic layer 371. For example, the first inorganic layer 371 contains silicon nitride such as SiN, and the second inorganic layer 372 contains silicon oxide such as $SiO_2$. A thickness of the first inorganic layer 371 is, for example, not less than 0.05 μm and not more than 5 μm. A thickness of the second inorganic layer 372 is, for example, not less than 0.1 μm and not more than 10 μm. Preferably, the thickness of the first inorganic layer 371 is smaller than the thickness of the second inorganic layer 372.

The organic layer 36 of the second wiring layer 32 is formed of an organic material having insulation properties. Similarly to the aforementioned organic layer 36 of the first wiring layer 31, polyimide, epoxy, acryl and so on can be used as an organic material of the organic layer 36 of the second wiring layer 32.

Method of Manufacturing Through Electrode Substrate

Herebelow, an example of a method of manufacturing the through electrode substrate 10 is described with reference to FIGS. 3 to 19.

(Step of Forming Through Hole)

Figure 3:
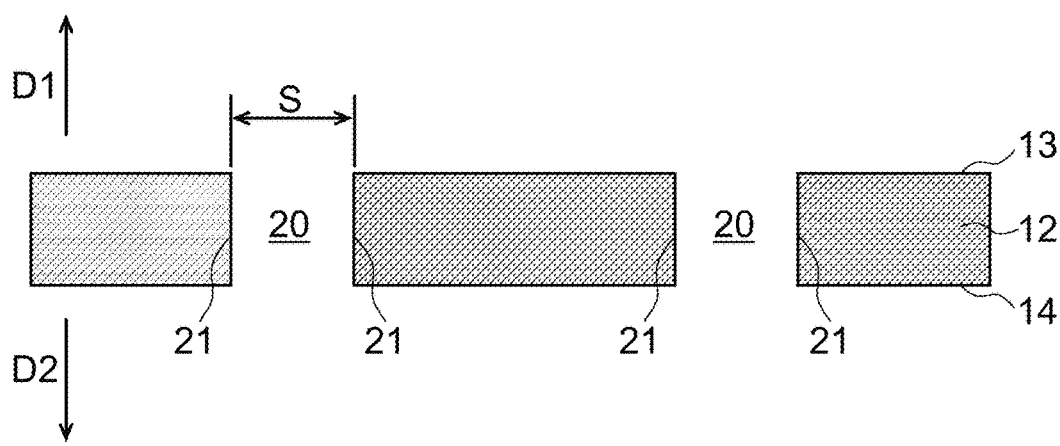
FIG. 3 is a view showing a manufacturing step of the through electrode substrate according to the first embodiment.

Firstly, the substrate 12 is prepared. Next, a resist layer is provided on at least any one of the first surface 13 and the second surface 14. Thereafter, an opening is provided in the resist layer at a position corresponding to each of the through holes 20. Then, by processing the substrate 12 in the opening of the resist layer, as shown in FIG. 3, the through hole 20 can be formed in the substrate 12. A size S of the through hole 20 is, for example, not less than 20 μm and not more than 150 μm. As a method of processing the substrate 12, a dry etching method, such as a reactive ion etching method or a deep reactive ion etching method, a wet etching method and the like may be used.

The through holes 20 may be formed in the substrate 12 by irradiating the substrate 12 with a laser. In this case, the resist layer may not be provided. As a laser for the laser machining, an excimer laser, an Nd:YAG laser, a femtosecond laser and so on may be used. When an Nd:YAG laser is used, a fundamental wave having a wavelength of 1064 nm, a second radiofrequency having a wavelength of 532 nm, and a third radiofrequency having a wavelength of 355 nm and so on may be used.

In addition, laser radiation and wet etching may suitably be combined. To be specific, an altered layer is formed by laser radiation on an area of the substrate 12, in which the through holes 20 should be formed. Then, the substrate 12 is immersed in hydrogen fluoride to etch the altered layer. Thus, the through holes 20 can be formed in the substrate 12.

In addition thereto, the through holes 20 may be formed in the substrate 12 by a blasting process that sprays an abrasive onto the substrate 12.

(Step of Forming Through Electrode)

Figure 4:
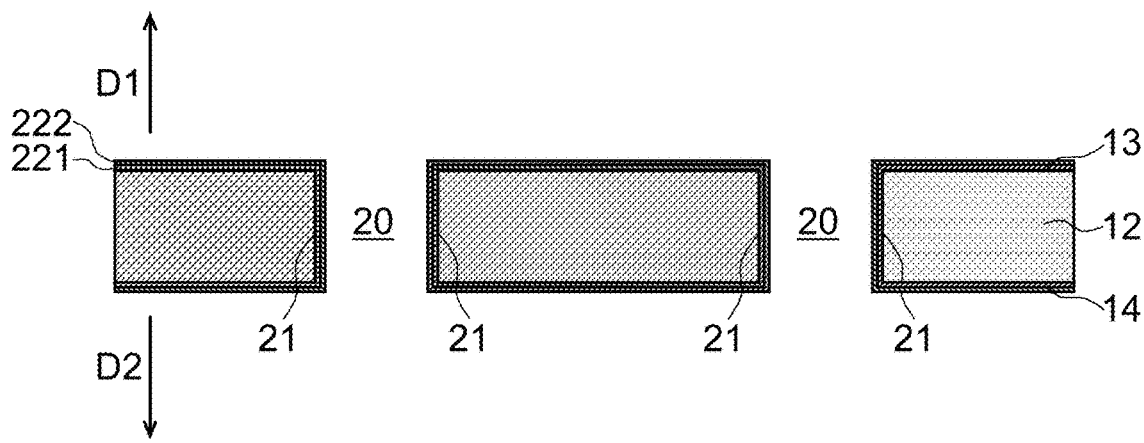
FIG. 4 is a view showing a manufacturing step of the through electrode substrate according to the first embodiment.
Figure 5:
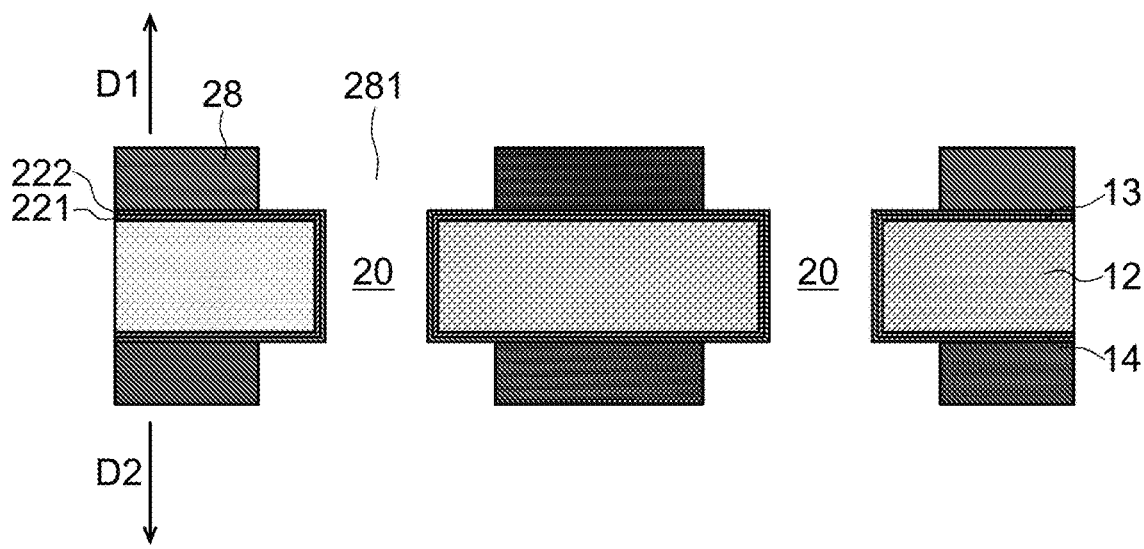
FIG. 5 is a view showing a manufacturing step of the through electrode substrate according to the first embodiment.
Figure 6:
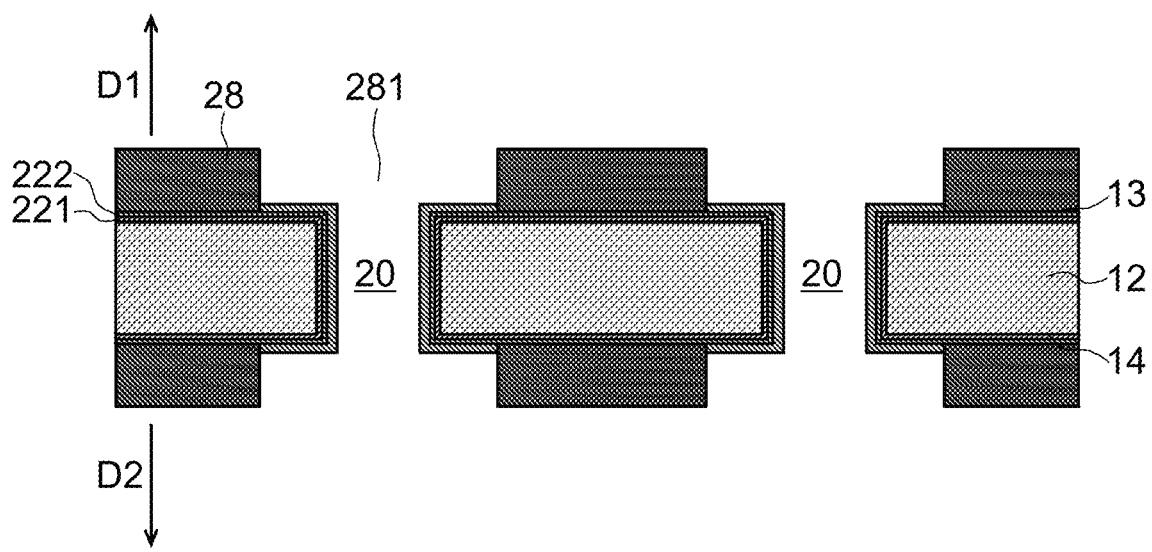
FIG. 6 is a view showing a manufacturing step of the through electrode substrate according to the first embodiment.
Figure 7:
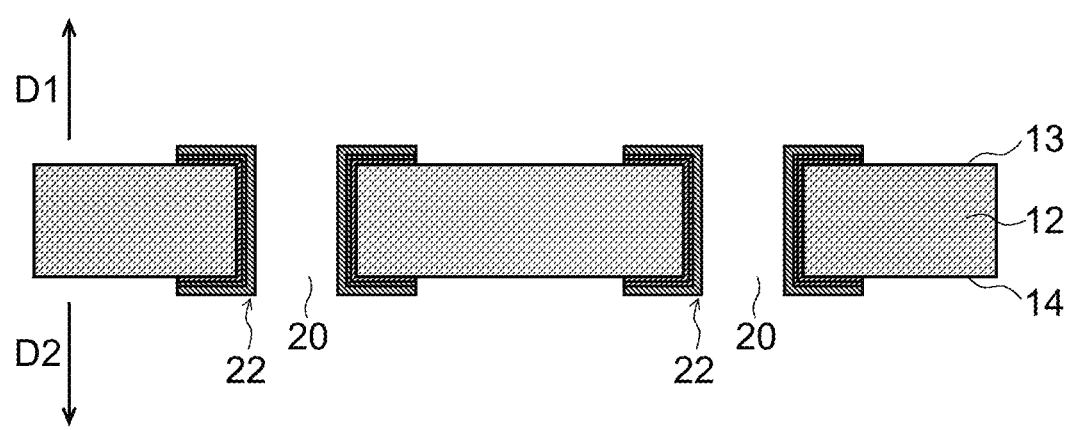
FIG. 7 is a view showing a manufacturing step of the through electrode substrate according to the first embodiment.

Next, the through electrode 22 is formed in the through hole 20 of the substrate 12. For example, as shown in FIG. 4, the barrier layer 221 and the seed layer 222 are firstly formed in this order on the first surface 13, the second surface 14 and the sidewall 21 of the substrate 12, by a physical film deposition method such as a vapor deposition method or a sputtering method. Following thereto, as shown in FIG. 5, a resist layer 28 provided with an opening 281 is formed on the seed layer 222. Following thereto, as shown in FIG. 6, the opening 281 of the resist layer 28 is supplied with a plating solution, so that a plated layer 223 is partially formed on the seed layer 222. Thereafter, the resist layer is removed, and portions of the barrier layer 221 and the seed layer 222, which are covered with the resist layer, are removed. In this manner, as shown in FIG. 7, the through electrode 22 including the sidewall portion 23, the first portion 24 and the second portion 25 can be obtained.

(Step of Forming Inorganic Film)

Figure 8:
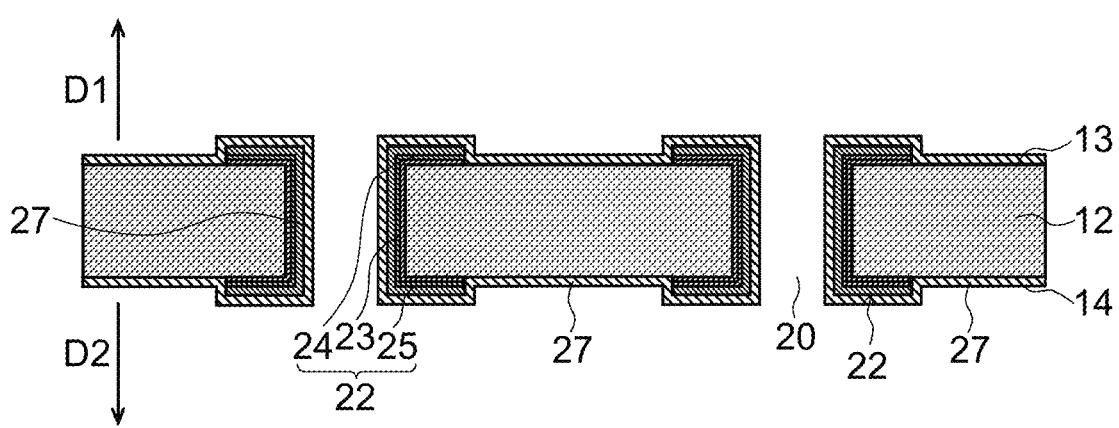
FIG. 8 is a view showing a manufacturing step of the through electrode substrate according to the first embodiment.

Next, as shown in FIG. 8, the organic film 27, which covers the surface of the substrate 12 and the through electrode 22, is formed by plasma CVD. For example, the first inorganic film containing SiN is firstly formed on the surface of the substrate 12 and the through electrode 22 is formed by plasma CVD. Following thereto, the second inorganic film containing $SiO_2$ is formed on the first inorganic film by plasma CVD.

(Step of Forming Organic Film)

Figure 9:
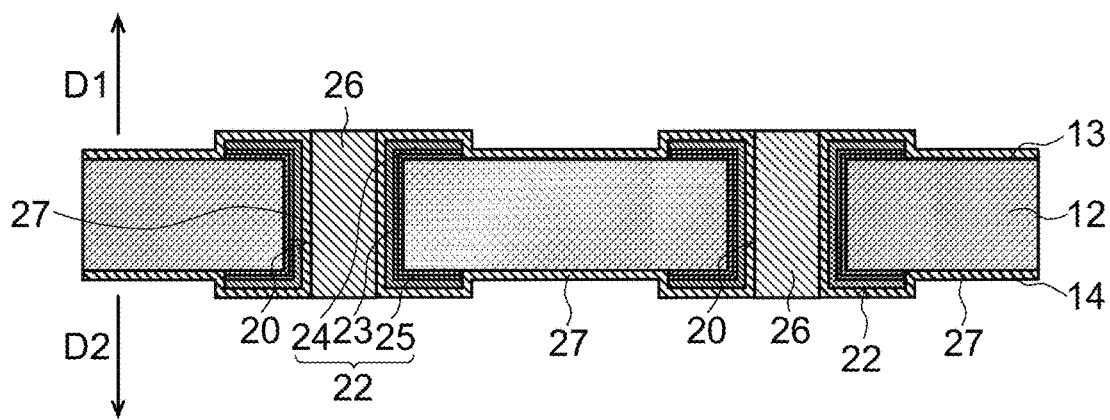
FIG. 9 is a view showing a manufacturing step of the through electrode substrate according to the first embodiment.

Next, as shown in FIG. 9, the through hole 20 is filled with the organic film 26. For example, a film including a resin layer for forming the organic film 26 is firstly disposed on the first side D1 and the second side D2 of the substrate 12. Following thereto, the film is pressurized so as to push the resin layer into the through hole 20. Thereafter, the resin layer having been pushed into the through hole 20 is cured by irradiating the resin layer with light. In addition, an unnecessary portion of the resin layer is removed. In this manner, the organic film 26 can be provided in the through hole 20.

(Step of Forming Organic Layer of First Wiring Layer)

Figure 10:
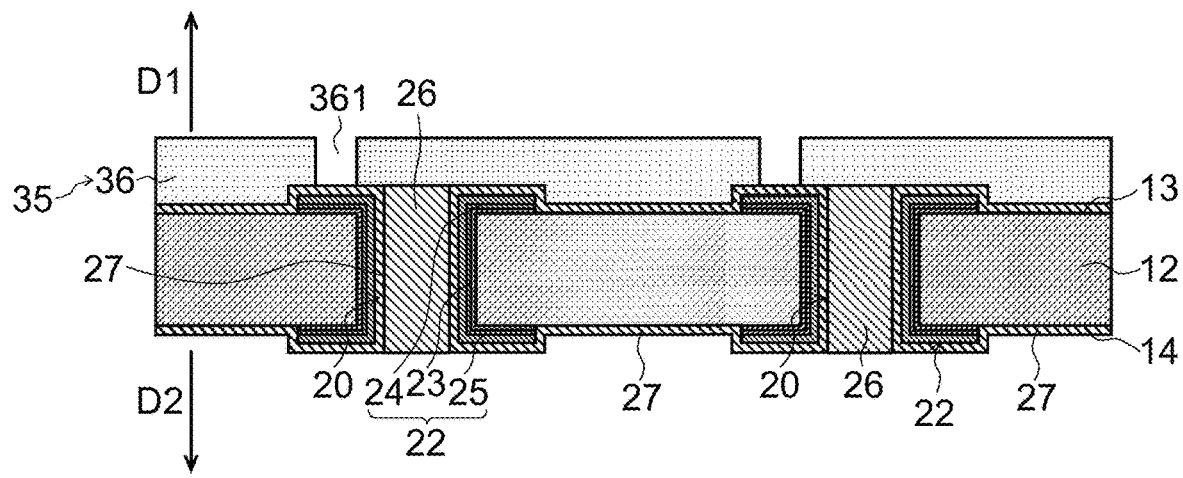
FIG. 10 is a view showing a manufacturing step of the through electrode substrate according to the first embodiment.

Next, as shown in FIG. 10, the organic layer 36 provided with an opening 361 positioned on the first portion 24 of the through electrode 22 is formed. For example, firstly, an organic material such as photosensitive polyimide is deposited on the substrate 12 by a spin coating method or the like, so as to form the organic layer 36. Following thereto, the organic layer 36 is exposed and developed such that a part of the organic layer 36, which corresponds to the opening 361, is removed. Following thereto, the organic layer 36 is baked to cure the organic layer 36. A baking temperature of the organic layer 36 is not less than 200° C., for example.

(Step of Processing Inorganic Film)

Figure 11:
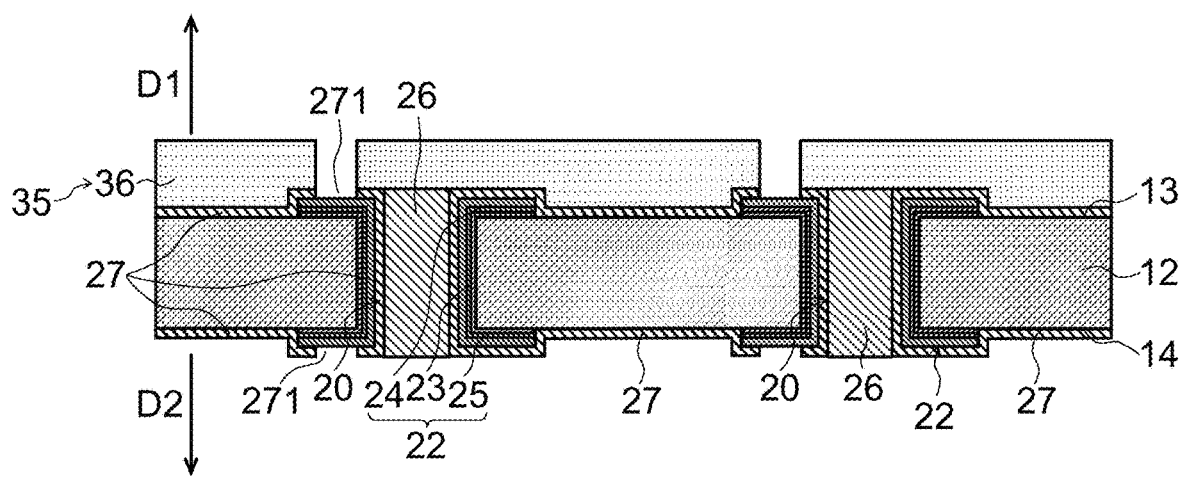
FIG. 11 is a view showing a manufacturing step of the through electrode substrate according to the first embodiment.

Next, the inorganic film 27 exposed to the opening 361 of the organic layer 36 is etched by plasma etching, with the organic layer 36 being used as a mask. Thus, as shown in FIG. 11, an opening 271 communicating with the opening 361 of the organic layer 36 is formed in the inorganic film 27. As an etching gas, a mixed gas of $CF_4$ and $H_2$ may be used, for example. If the surface of the organic layer 36 is damaged by plasma etching, the damaged surface of the organic layer 36 may be removed by thermally processing the organic layer 36. A thermal processing temperature of the organic layer 36 is not less than 200° C., for example.

(Step of Forming Electroconductive Layer of First Wiring Layer)

Figure 12:
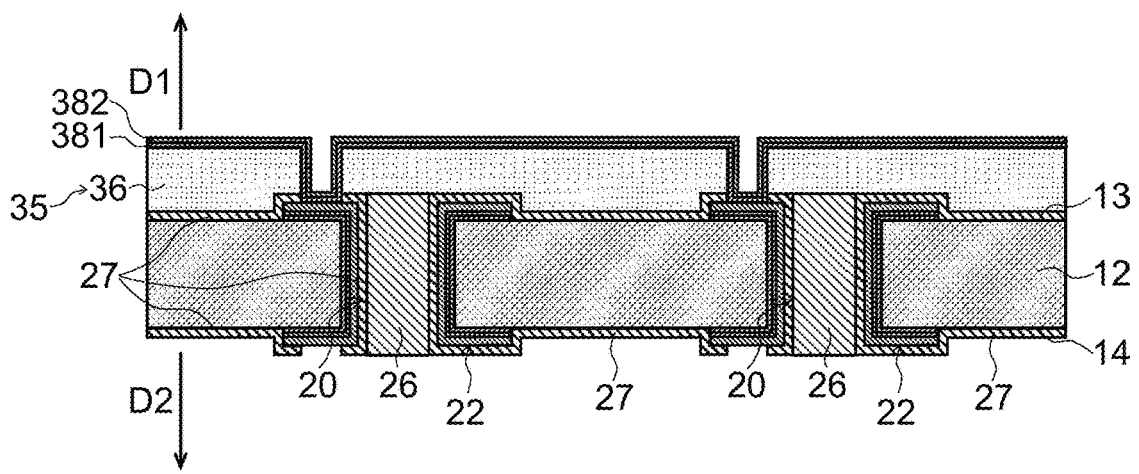
FIG. 12 is a view showing a manufacturing step of the through electrode substrate according to the first embodiment.

Next, as shown in FIG. 12, the barrier layer 381 is formed on the surface of the organic layer 36, the sidewall of the opening of the organic layer 36, and the sidewall of the opening of the inorganic film 27 by a physical film deposition method. In addition, the seed layer 382 is formed on the barrier layer 381 by a physical film deposition method.

Figure 13:
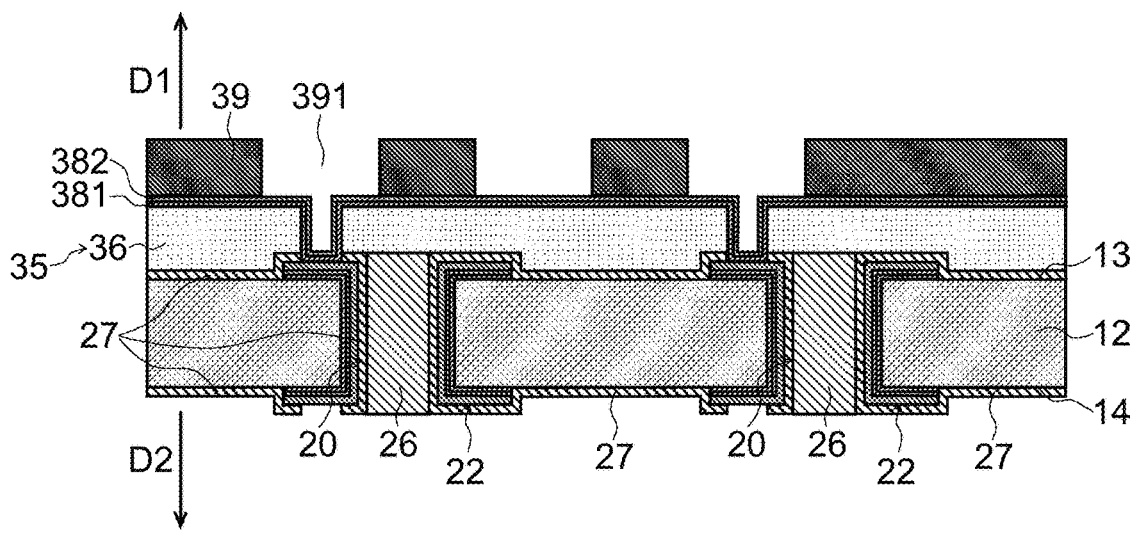
FIG. 13 is a view showing a manufacturing step of the through electrode substrate according to the first embodiment.
Figure 14:
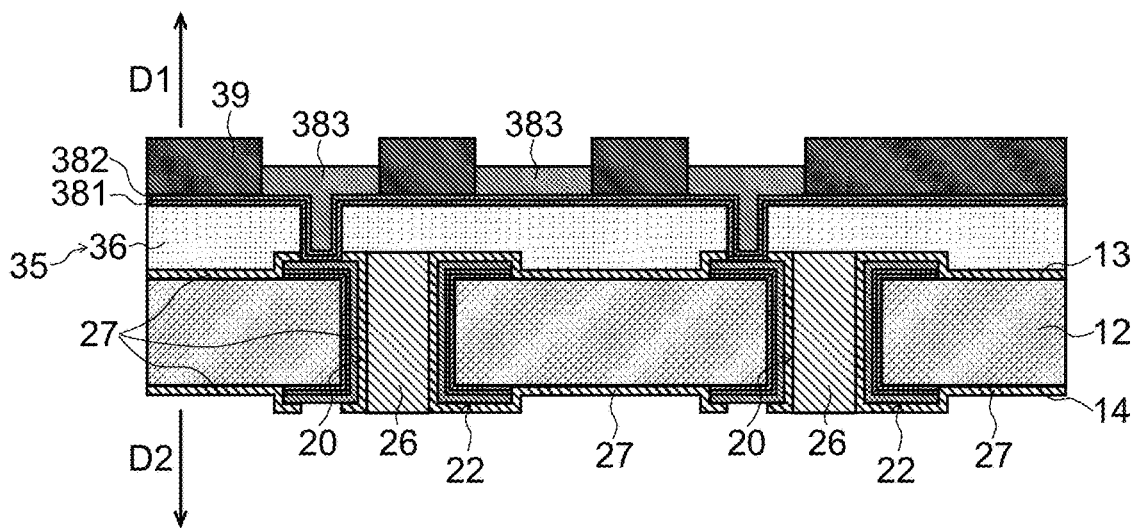
FIG. 14 is a view showing a manufacturing step of the through electrode substrate according to the first embodiment.
Figure 15:
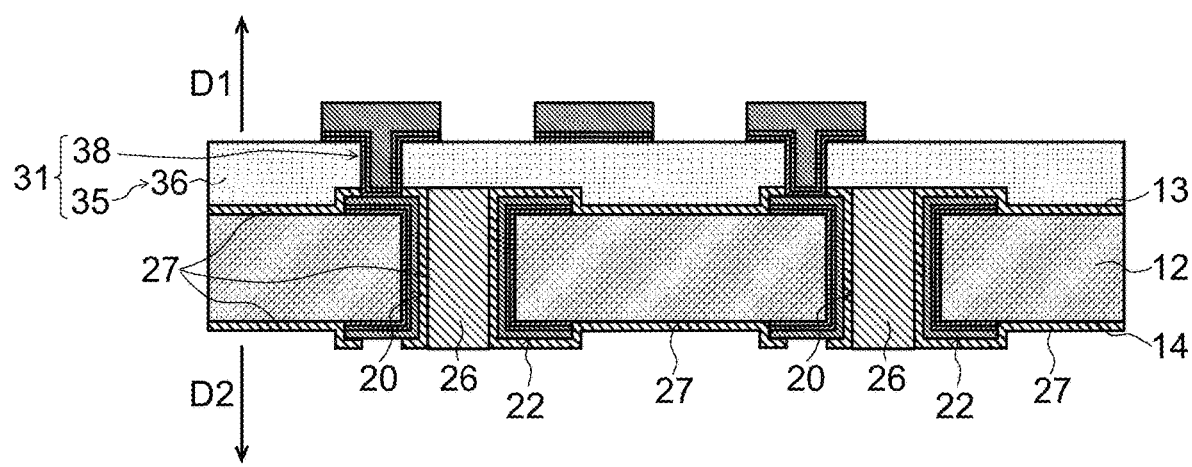
FIG. 15 is a view showing a manufacturing step of the through electrode substrate according to the first embodiment.

Following thereto, as shown in FIG. 13, a resist layer 39 provided with an opening 391 is formed on the seed layer 382. Following thereto, as shown in FIG. 14, the opening 391 of the resist layer 39 is supplied with a plating solution, so that the plated layer 383 is formed on the seed layer 382 by electrolytic plating. Then, the resist layer 39 is removed. Following thereto, portions of the barrier layer 381 and the seed layer 382, which are covered with the resist layer 39, are removed by wet etching, for example. In this manner, as shown in FIG. 15, the electroconductive layer 38, which includes the barrier layer 381, the seed layer 382 and the plated layer 383, can be formed. Thereafter, a step of annealing the plated layer 383 may be performed. An annealing temperature of the plated layer 383 is not less than 200° C., for example.

In this manner, the first wiring layer 31 including the organic layer 36 and the electroconductive layer 38 can be formed.

(Step of Forming Inorganic Layer of Second Wiring Layer)

Figure 16:
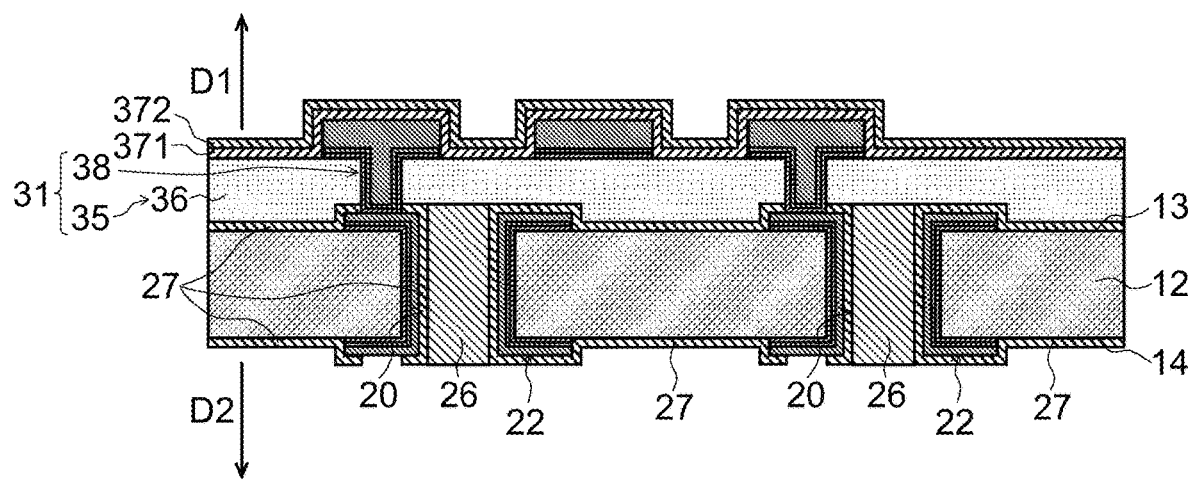
FIG. 16 is a view showing a manufacturing step of the through electrode substrate according to the first embodiment.

Next, as shown in FIG. 16, a first inorganic layer 371 is formed on the organic layer 36 and the electroconductive layer 38 of the first wiring layer 31 by plasma CVD. Following thereto, as shown in FIG. 16, a second inorganic layer 372 is formed on the first inorganic layer 371 by plasma CVD.

(Step of Forming Organic Layer of Second Wiring Layer)

Figure 17:
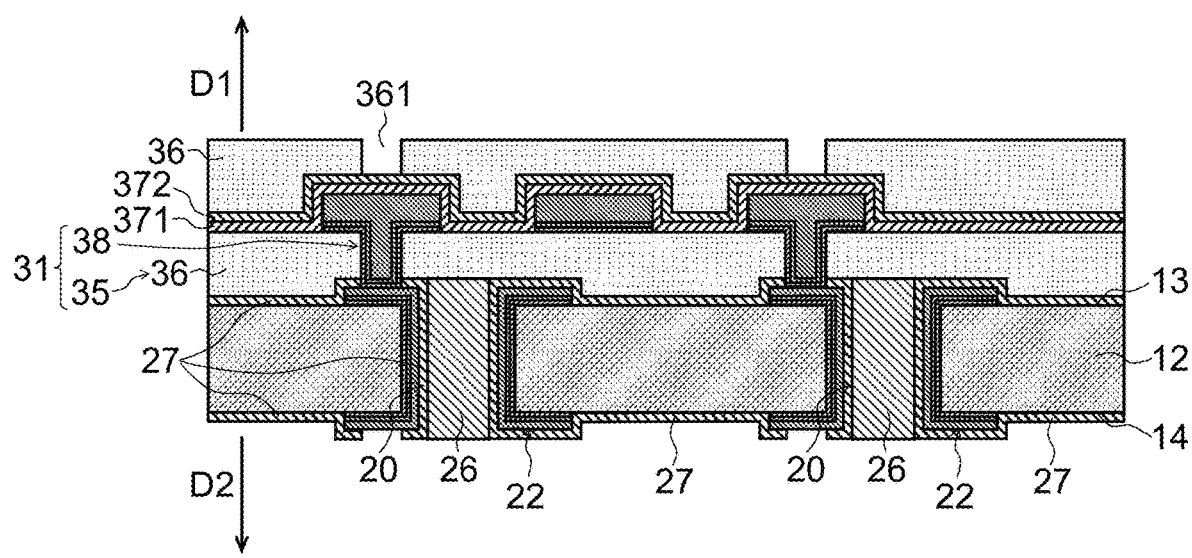
FIG. 17 is a view showing a manufacturing step of the through electrode substrate according to the first embodiment.

Next, as shown in FIG. 17, an organic layer 36 is formed such that the organic layer 36 is provided with an opening 361 at a position overlapped with the conductive layer 38 of the first wiring layer 31, when seen along the normal direction of the first surface 13 of the substrate 12. For example, firstly, an organic material such as photosensitive polyimide is deposited on the second inorganic layer 372 by a spin coating method, so as to form the organic layer 36. Following thereto, the organic layer 36 is exposed and removed such that a part of the organic layer 36, which corresponds to the opening 361, is removed. Following thereto, the organic layer 36 is baked to cure the organic layer 36. A baking temperature of the organic layer 36 is not less than 200° C., for example.

(Step of Processing Inorganic Layer of Second Wiring Layer)

Figure 18:
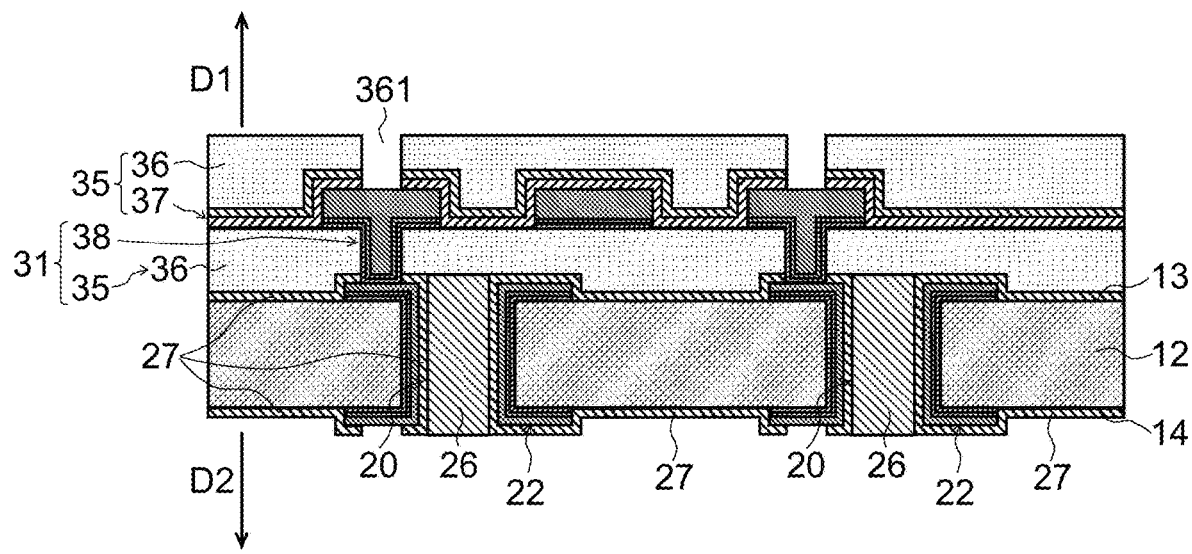
FIG. 18 is a view showing a manufacturing step of the through electrode substrate according to the first embodiment.

Next, the first inorganic layer 371 and the second inorganic layer 372 of the inorganic layer 37, which are exposed to the opening 361 of the inorganic layer 36, are etched by plasma etching, with the organic layer 36 being used as a mask. Thus, as shown in FIG. 18, an opening communicating with the opening 361 of the organic layer 36 is formed in the inorganic layer 37. As an etching gas, a mixed gas of $CF_4$ and $H_2$ may be used, for example. If the surface of the organic layer 36 is damaged by plasma etching, the damaged surface of the organic layer 36 may be removed by thermally processing the organic layer 36. A thermal processing temperature of the organic layer 36 is not less than 200° C., for example.

(Step of Forming Electroconductive Layer of Second Wiring Layer)

Figure 19:
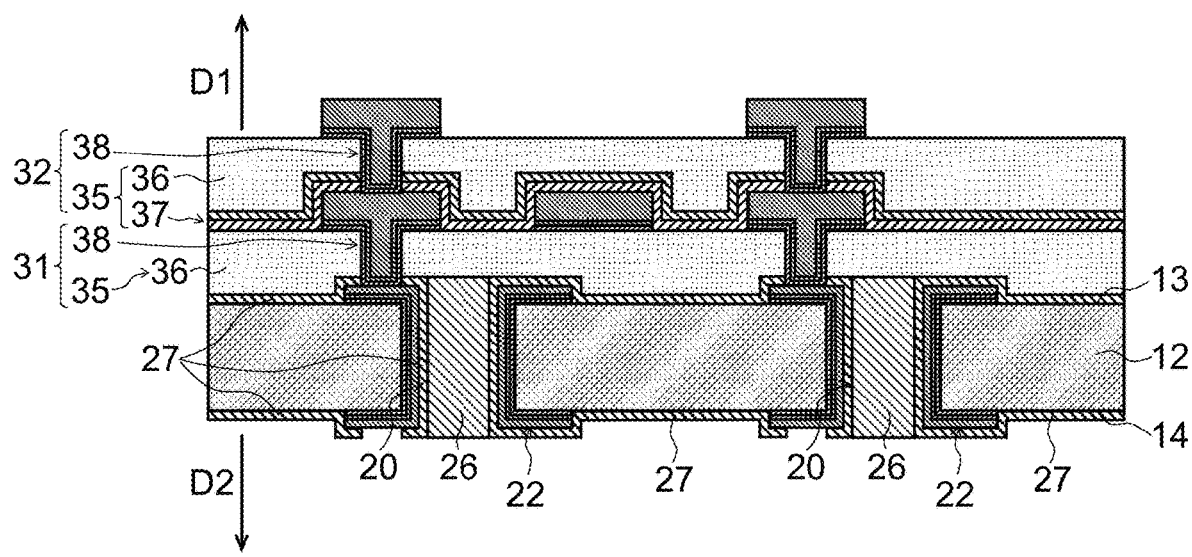
FIG. 19 is a view showing a manufacturing step of the through electrode substrate according to the first embodiment.

Next, as shown in FIG. 19, an electroconductive layer 38, which is connected to the electroconductive layer 38 of the first wiring layer 31 and reaches the first side D1 of the organic layer 36, is formed. In this manner, the second wiring layer 32, which includes the organic layer 36, the inorganic layer 37 and the electroconductive layer 38, can be formed on the first side D1 of the first wiring layer 31.

(Operations of Through Electrode Substrate)

Operations of the through electrode substrate 10 according to this embodiment is described.

(Operation of Through Electrode for Reducing Residual Stress)

A coefficient of thermal expansion of a metal material, such as copper, forming the through electrode 22 is larger than a coefficient of thermal expansion of an insulating inorganic material, such a glass or silicon, forming the substrate 12. Thus, in the baking step of the organic layer 36 and the annealing step of the electroconductive layer 38, when an atmospheric temperature becomes not less than 200° C., there is a possibility that the through electrode 22 expands. When a step in which an atmospheric temperature becomes not less than 200° C. is repeatedly performed, expansion and shrinkage of the through electrode 22 repeatedly occur, so that a residual stress is generated in the through electrode 22. In this case, a defect such as a void may be formed between the first portion 24 of the through electrode 22 and the electroconductive layer of the first wiring layer, because of relatively a low mechanical connection strength. As a result, there is a possibility that electric connection failure may occur between the first portion 24 of the through electrode 22 and electroconductive layer 38 of the first wiring layer 31.

On the other hand, in this embodiment, the inorganic film 27 at least partially covers the first portion 24 of the through electrode 22. A coefficient of inorganic material forming the inorganic film 27 is small, e.g., not less than 0.3 E-6/K and not more than 10.0 E-6/K. Thus, a residual stress generated in the first portion 24 of the through electrode 22 can be reduced, whereby it can be prevented that a defect such as a void is formed between the first portion 24 of the through electrode 22 and the electroconductive layer 38 of the first wiring layer 31. In addition, a Young's modulus of the inorganic material forming the inorganic film 27 is high, e.g., not less than 70 GPa. This also contributes the reduction in residual stress generated in the first portion 24 of the through electrode 22. Due to these facts, it can be prevented that electric connection failure occurs between the first portion 24 of the through electrode 22 and the electroconductive layer 38 of the first wiring layer 31.

(Operation of Preventing Diffusion of Copper into Organic Layer)

In addition, since the inorganic film 27 covers the first portion 24 of the through electrode 22, when an atmospheric temperature is high, it can be prevented that atoms, molecules and ions of a metal material, such as copper, forming the first portion 24 of the through electrode 22 diffuse into the organic layer 36 of the insulation layer 35 of the first wiring layer 31. Thus, it can be prevented that the adjacent two electroconductive layers 38 of the first wiring layer 31 communicate with each other, and that the organic layer 36 suffers electric breakdown. In addition, it can be prevented that the thickness of the first portion 24 of the through electrode 22 is decreased by the diffusion of the metal material, resulting in increase in resistance and/or disconnection of the first portion 24.

(Operation of Preventing Diffusion of Copper into Organic Film)

In addition, in this embodiment, the inorganic film 27 further covers the sidewall portion 23 of the through electrode substrate 22. Thus, when an atmospheric temperature is high, it can be prevented that atoms, molecules and ions of a metal material, such as copper, forming the sidewall portion 23 of the through electrode 22 diffuse into the organic film 26 inside the through hole 20. Thus, it can be prevented that the thickness of the sidewall portion 23 is decreased, resulting in increase in resistance and/or disconnection of the sidewall portion 23.

(Operation of Preventing Transmission Delay and Crosstalk)

In addition, the insulation layer 35 of wiring layers such as the first wiring layer 31 and the second wiring layer 32 is formed of an organic material such as polyimide, and includes the organic layer 36 in contact with the electroconductive layer 38. The organic material of the organic layer 36 has a relative dielectric constant smaller than that of an inorganic material forming the inorganic layer 37. For example, the relative dielectric constant of the organic material of the organic layer 36 is not less than 2.0 and not more than 3.3, while the relative dielectric constant of P—SiO$_2$, which is an example of the inorganic material of the inorganic layer 37, is 4.1. By positioning the organic layer 36 formed of such an organic material between the adjacent two electroconductive layers 38 in the wiring layers, a wiring capacity between the electroconductive layers 38 can be decreased, so that an amount of delay of a signal that transmits through the electroconductive layers 38 can be decreased. In addition, crosstalk between the adjacent two electroconductive layers 38 can be prevented. From the point of view of preventing the transmission delay and the crosstalk, a ratio of the organic layer 36 with respect to the whole thickness of the insulation layer 35 is preferably not less than 40% and not more than 90%, in the wiring layers such as the first wiring layer 31 and the second wiring layer 32.

(Operation of Preventing Warp)

A coefficient of thermal expansion of the organic material, such as polyimide, forming the organic layer 36 is larger than a coefficient of thermal expansion of the inorganic material forming the substrate 12 and the through electrode 22. For example, the coefficient of thermal expansion of the organic material forming the organic layer 36 is 50 to 100 E-6/K, while the coefficient of thermal expansion of copper forming the through electrode 22 is about 16 E-6/K. In addition, a coefficient of thermal expansion of glass, which is an example of the material of the substrate 12, is about 3 E-6K, while a coefficient of thermal expansion of silicon, which is another example of the material of the substrate 12, is about 2.4 E-6/K. Thus, in the baking step of the organic layer 36 and the annealing step of the electroconductive layer 38, when an atmospheric temperature becomes not less than 200° C., there is a possibility that a tensile stress is generated in the substrate 12 and the through electrode 22 because of the thermal expansion of the organic layer 36. As a result, the substrate 12 may be warped.

In this embodiment, the inorganic film 27 further covers the first surface 13 of the substrate 12. A coefficient of thermal expansion of an inorganic material forming the inorganic film 27 is smaller than the coefficient of thermal expansion of the organic material forming the organic layer 36, e.g., not less than 0.3 E-6/K and not more than 10.0 E-6/K. Thus, it can be prevented that a tensile stress is generated in the substrate 12 and the through electrode 22 because of the thermal expansion of the organic layer 36. As a result, it can be prevented that the substrate 12 is warped.

In addition, in this embodiment, the first wiring structure 30 includes the inorganic layer 37 in addition to the organic layer 36. For example, the second wiring layer 32 of the first wiring structure 30 includes the organic layer 36 of the first wiring layer 31 and the inorganic layer 37 positioned on the electroconductive layer 38. A coefficient of thermal expansion of an inorganic material forming the inorganic layer 37 is smaller than the coefficient of thermal expansion of the organic material forming the organic layer 36, e.g., not less than 0.3 E-6/K and not more than 10.0 E-6/K. Thus, it can be further prevented that a tensile stress is generated in the substrate 12 because of the thermal expansion of the organic layer 36. As a result, it can be further prevented that the substrate 12 is warped. From the point of view of preventing warp, a ratio of the thickness of the inorganic layer 37 with respect to the whole thickness of the insulation layer 35 is preferably not less than 10% and not more than 60%, in the wiring layers such as the first wiring layer 31 and the second wiring layer 32.

(Other Operations of Organic Layer)

In addition, in this embodiment, the inorganic layer 37 is positioned between the plated layer 383 and the organic layer 36, and includes the first inorganic layer 371 formed of silicon nitride such as SiN. Thus, when an atmospheric temperature is high, it can be prevented that atoms, molecules and ions of a metal material, such as copper, forming the plated layer 383 diffuse into the organic layer 36. Thus, it can be prevented that the adjacent two electroconductive layers 38 communicate with each other, and that the organic layer 36 suffers electric breakdown.

In addition, in this embodiment, the inorganic layer 37 covers the second portion 38b of the electroconductive layer 38 of the first wiring layer 31. Thus, a residual stress generated in the electroconductive layer 38 of the first wiring layer 31 can be reduced, whereby it can be prevented that a defect such as a void is formed in the electroconductive layer 38 of the first wiring layer 31 and the electroconductive layer 38 of the second wiring layer 32. Thus, it can be prevented that electric connection failure occurs between the electroconductive layer 38 of the first wiring layer 31 and the electroconductive layer 38 of the second wiring layer 32.

(Mounting Substrate)

Herebelow, an example of the use of the through electrode substrate 10 according to this embodiment is described. Herein, an example in which a mounting substrate 60 is formed by loading an element 61 on the through electrode substrate 10 is described.

Figure 20:
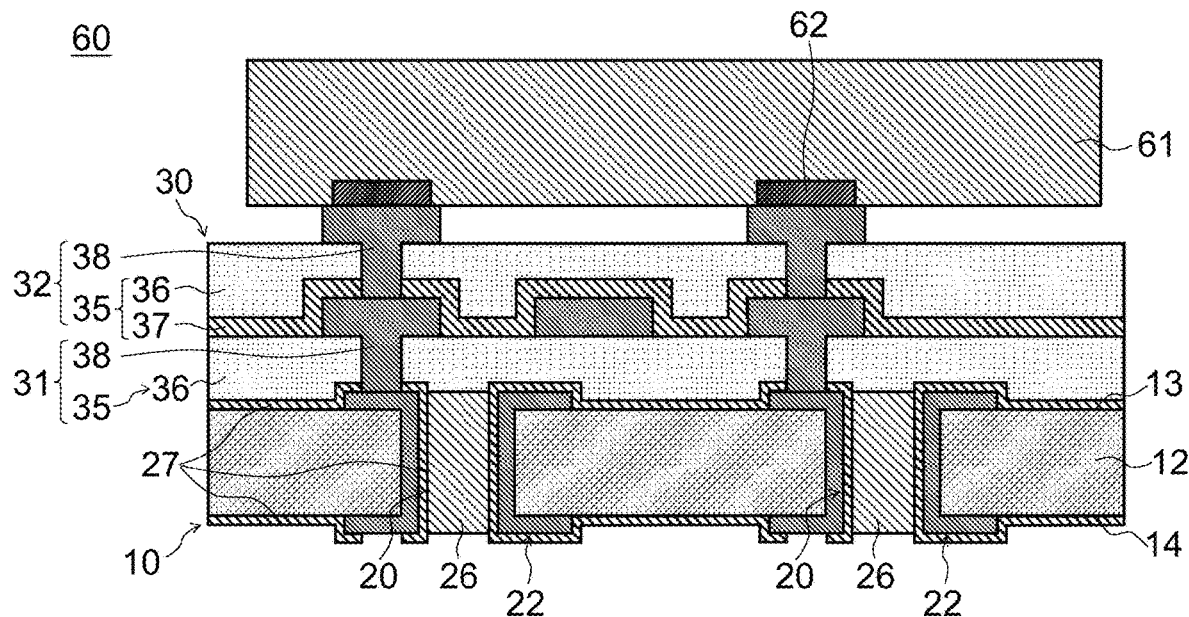
FIG. 20 is a sectional view showing an example of a mounting substrate comprising a through electrode substrate.

FIG. 20 is a sectional view showing the mounting substrate 60. The mounting substrate 60 comprises the through electrode substrate 10, and an element 61 loaded on the through electrode substrate 10 on the side of the first surface 13 of the substrate 12. The element 61 is an LSI chip such as a logic IC or a memory IC. The element 61 may be a MEMS (Micro Electro Mechanical Systems) chip. A MEMS chip is an electronic device in which a mechanical component, a sensor, an actuator, an electronic circuit and so on are integrated on one substrate. As shown in FIG. 20, the element 61 has a terminal 62 connected to the electroconductive layer 38 of the first wiring structure 30 of the through electrode substrate 10.

The aforementioned first embodiment can be variously modified. Herebelow, modification examples are described with reference to the drawings according to need. In the below description and the drawings for the description, the same part as that of the first embodiment is shown by the same reference number, and detailed description thereof is omitted. In addition, when the effect obtained in the first embodiment is apparently obtained also in the modification examples, description thereof may be omitted.

First Modification Example

Figure 21:
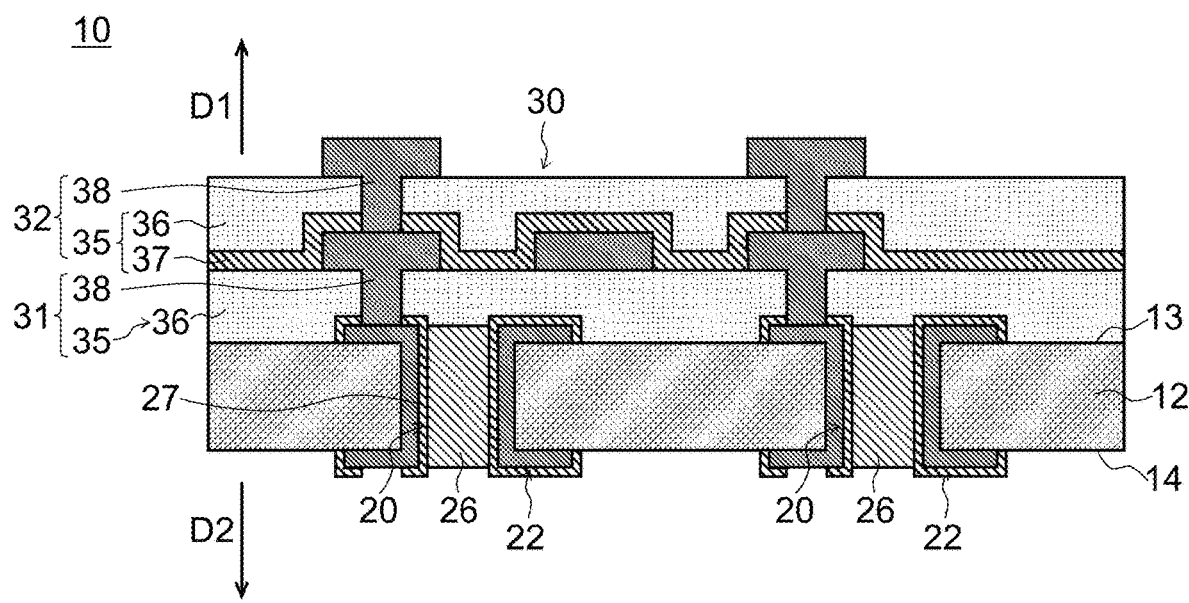
FIG. 21 is a sectional view showing a through electrode substrate according to a first modification example.

FIG. 21 is a sectional view showing a through electrode substrate 10 according to a first modification example. As shown in FIG. 21, the inorganic film 27 may cover the through electrode 22, but may not cover the surface of the substrate 12. For example, the inorganic film 27 may cover the sidewall portion 23, the first portion 24 and the second portion 25 of the through electrode 22, but may not cover the first surface 13 and the second surface 14 of the substrate 12.

Second Modification Example

Figure 22:
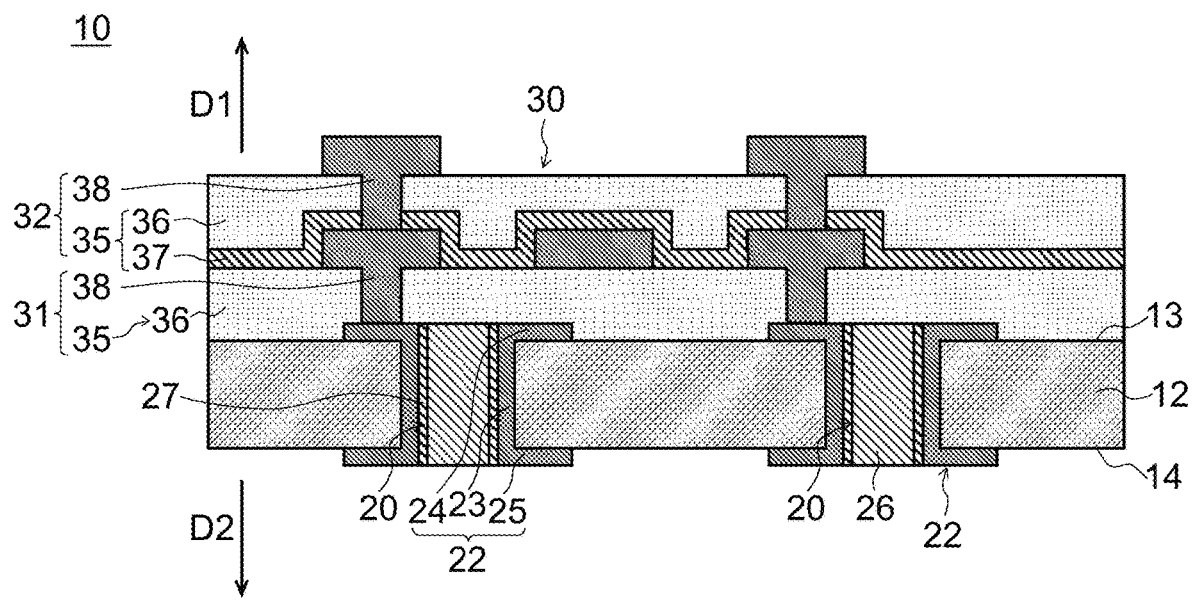
FIG. 22 is a sectional view showing a through electrode substrate according to a second modification example.

FIG. 22 is a sectional view showing a through electrode substrate 10 according to a second modification example. The inorganic film 27 may cover a part of the through electrode 22, and may not cover another part. For example, as shown in FIG. 22, the inorganic film 27 may cover the sidewall portion 23 of the through electrode 22, but may not cover the first portion 24 and the second portion 25 of the through electrode 22. In addition, although not shown, the inorganic film 27 may cover the first portion 24 of the through electrode 22, but may not cover the sidewall portion 23 of the through electrode 22.

Third Modification Example

Figure 23:
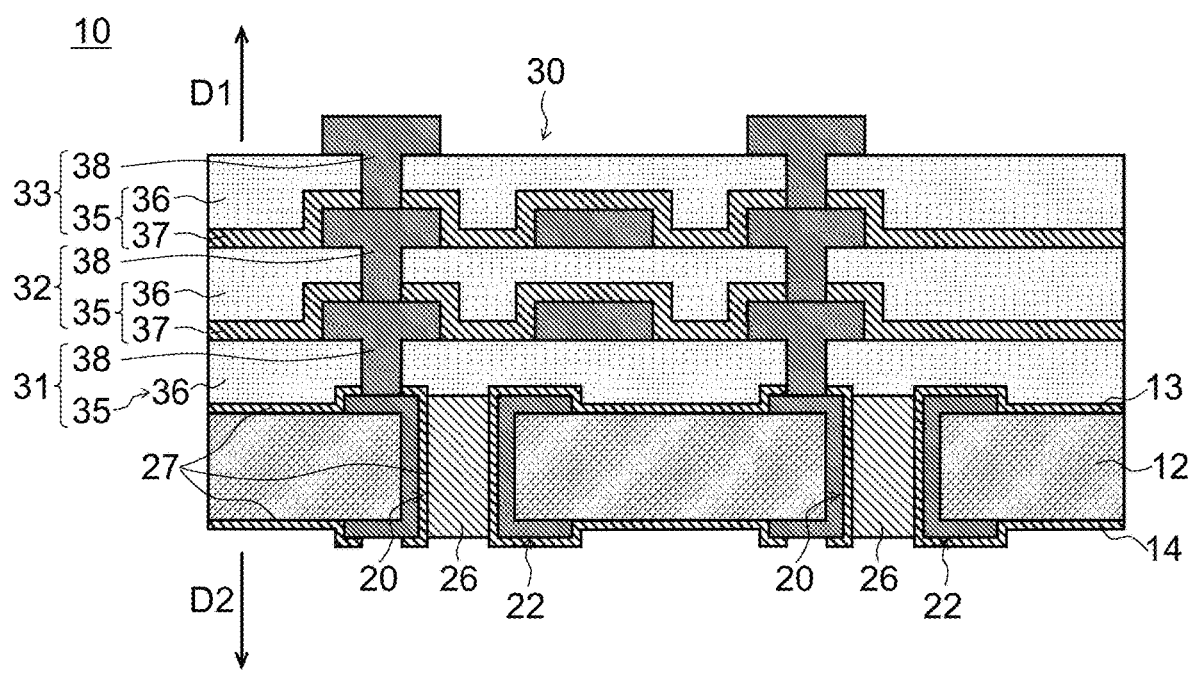
FIG. 23 is a sectional view showing a through electrode substrate according to a third modification example.

FIG. 23 is a sectional view of a through electrode 10 according to a third modification example. As shown in FIG. 23, the first wiring structure 30 of the through electrode substrate 10 may further include a third wiring layer 33 positioned on the second wiring layer 32. The third wiring layer 33 has an insulation layer 35 provided with an opening positioned on the electroconductive layer 38 of the second wiring layer 32, and an electroconductive layer 38 connected to the electroconductive layer 38 of the second wiring layer 32 through the opening of the insulation layer 35. The insulation layer 35 of the third wiring layer 33 includes an inorganic layer 37 and an organic layer 36 positioned to the first side D1 of the inorganic layer 37. The inorganic layer 37 of the third wiring layer 33 at least partially covers the electroconductive layer 38 of the second wiring layer 32.

Fourth Modification Example

Figure 24:
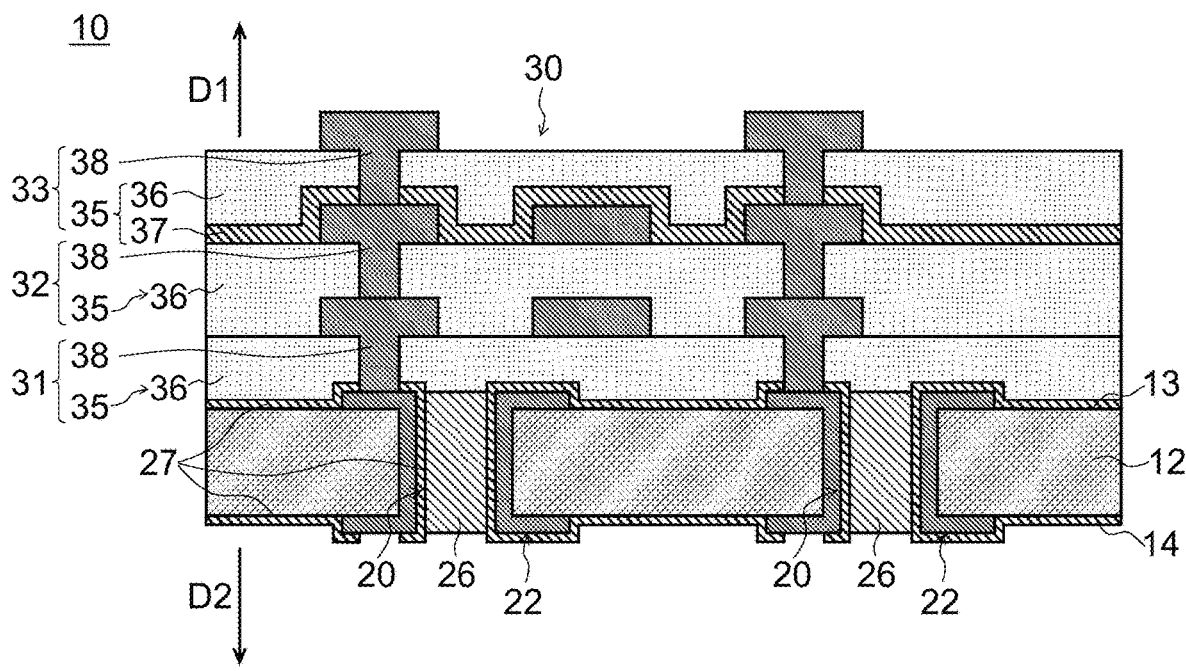
FIG. 24 is a sectional view showing a through electrode substrate according to a fourth modification example.

In the third modification example shown in FIG. 23, both the second wiring layer 32 and the third wiring layer 33 have the inorganic layer 37. However, not limited thereto, at least one of the plurality of wiring layers of the first wiring structure 30 may include the inorganic layer 37. For example, as shown in FIG. 24, the insulation layer 35 of the third wiring layer 33 may include the inorganic layer 37, but the insulation layer 35 of the second wiring layer 32 may not include the inorganic layer 37. Alternatively, although not shown, the insulation layer 35 of the second wiring layer 32 may include the inorganic layer 37, but the insulation layer 35 of the third wiring layer 33 may not include the inorganic layer 37. Since at least one of the plurality of wiring layers of the first wiring structure 30 includes the inorganic layer 37, it can be prevented that the substrate 12 is warped. In addition, since a residual stress generated in the electroconductive layer 38, which is positioned to the second side D2 of the inorganic layer 37, can be reduced, it can be prevented that a defect such as a void is formed in the electroconductive layer 38.

Fifth Modification Example

Figure 25:
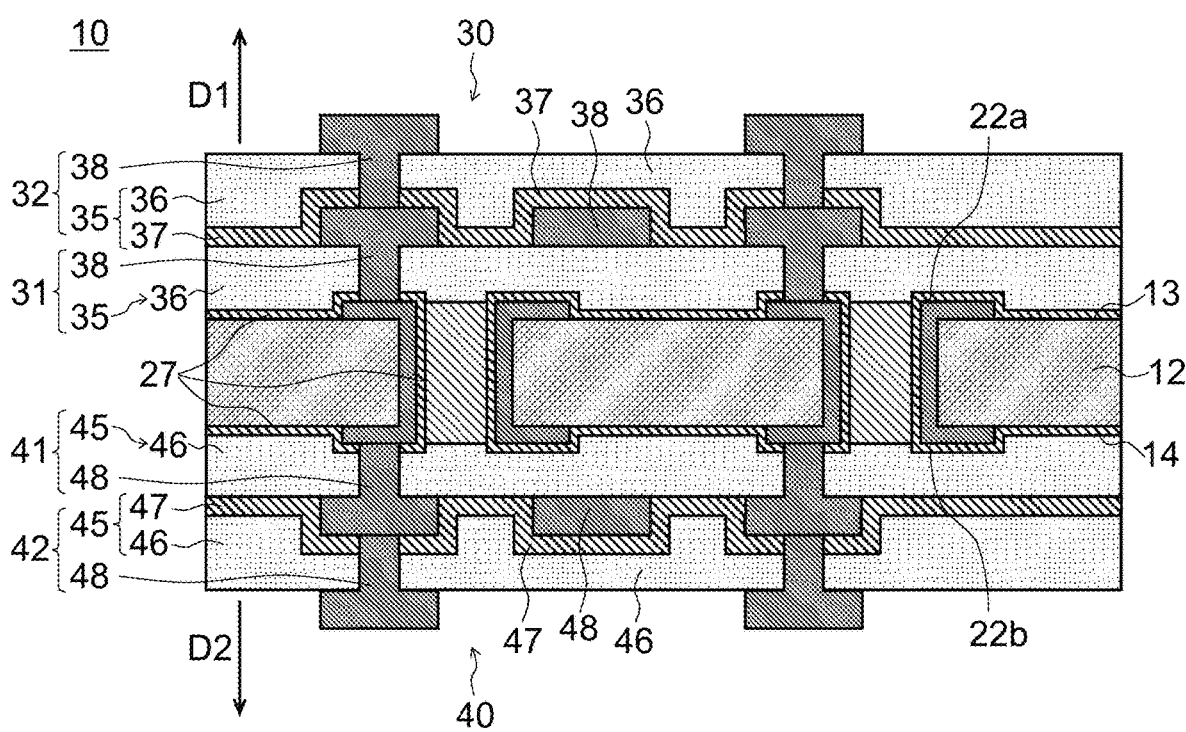
FIG. 25 is a sectional view showing a through electrode substrate according to a fifth modification example.

As shown in FIG. 25, the through electrode substrate 10 may further comprise a second wiring structure 40 including at least a first wiring layer 41 positioned on the second surface 14 and a second wiring layer 42 positioned on the first wiring layer 41.

Similarly to the first wiring layer 31 of the first wiring structure 30, the first wiring layer 41 includes an insulation layer 45 and an electroconductive layer 48. The insulation layer 45 is provided with an opening that communicates with the opening of the inorganic film 27 positioned on the second portion 25 of the through electrode 22. The electroconductive layer 48 is connected to the second portion 25 of the through electrode 22 through the opening of the insulation layer 45 and the opening of the inorganic film 27.

Similarly to the insulation layer 35 of the first wiring layer 31, the insulation layer 45 of the first wiring layer 41 includes an organic layer 46 formed of an organic material having insulation properties. As an organic material of the organic layer 46, polyimide, epoxy, acryl and so on can be used, for example. A thickness of the insulation layer 45 is, for example, not less than 0.5 µm and not more than 10 µm.

Similarly to the electroconductive layers 38 of the first wiring layer 31 and the second wiring layer 32, the electroconductive layer 48 contains a metal material having electroconductive properties. Similarly to the electroconductive layer 38, the insulation layer 48 may include a plurality of layers such as a barrier layer, a seed layer and a plated layer, which are laminated in this order from the surface side of the substrate 12.

Similarly to the first wiring layer 41, the second wiring layer 42 also has an insulation layer 45 and an electroconductive layer 48. The insulation layer 45 is provided with an opening positioned on the electroconductive layer 48 of the first wiring layer 41. The electroconductive layer 48 is connected to the electroconductive layer 48 of the first wiring layer 41 through the opening of the insulation layer 45.

The insulation layer 45 of the second wiring layer 42 has an inorganic layer 47 positioned on the insulation layer 45 and the electroconductive layer 48 of the first wiring layer 41, and an organic layer 46 positioned to the second side D2 of the inorganic layer 47. The inorganic layer 47 at least partially covers the electroconductive layer 48 of the first wiring layer 41. Herein, the term "cover" means that, when the through electrode substrate 10 is seen along the normal direction of the second surface 14 of the substrate 12, the inorganic layer 47 of the second wiring layer 42 and the electroconductive layer 48 of the first wiring layer 41 are at least partially overlapped. Similarly to the inorganic layer 37 of the first wiring structure 30, the inorganic layer 47 is a layer formed of an inorganic material having insulation properties. Since the inorganic material forming the inorganic layer 47 and the layer structure of the inorganic layer 47 are the same as those of the inorganic layer 37, description thereof is omitted.

The organic layer 46 of the second wiring layer 42 is formed of an organic material having insulation properties. Similarly to the aforementioned organic layer 46 of the first wiring layer 41, as an organic material of the organic layer 46 of the second wiring layer 42, polyimide, epoxy, acryl and so on can be used, for example.

Sixth Modification Example

In the aforementioned fifth modification example, the number of the electroconductive layers 38 included in the first wiring structure 30 positioned on the first side D1 of the substrate 12, and the number of the electroconductive layers 48 included in the second wiring structure 40 positioned on the second side D2 of the substrate 12 are the same with each other. However, the number of the electroconductive layers 38 included in the first wiring structure 30 and the number of the electroconductive structures 48 included in the second wiring structure 40 may differ from each other. For example, the number of the electroconductive layers 48 included in the second wiring structure 40 may be smaller than the number of the electroconductive layers 38 included in the first wiring structure 30.

Figure 45:
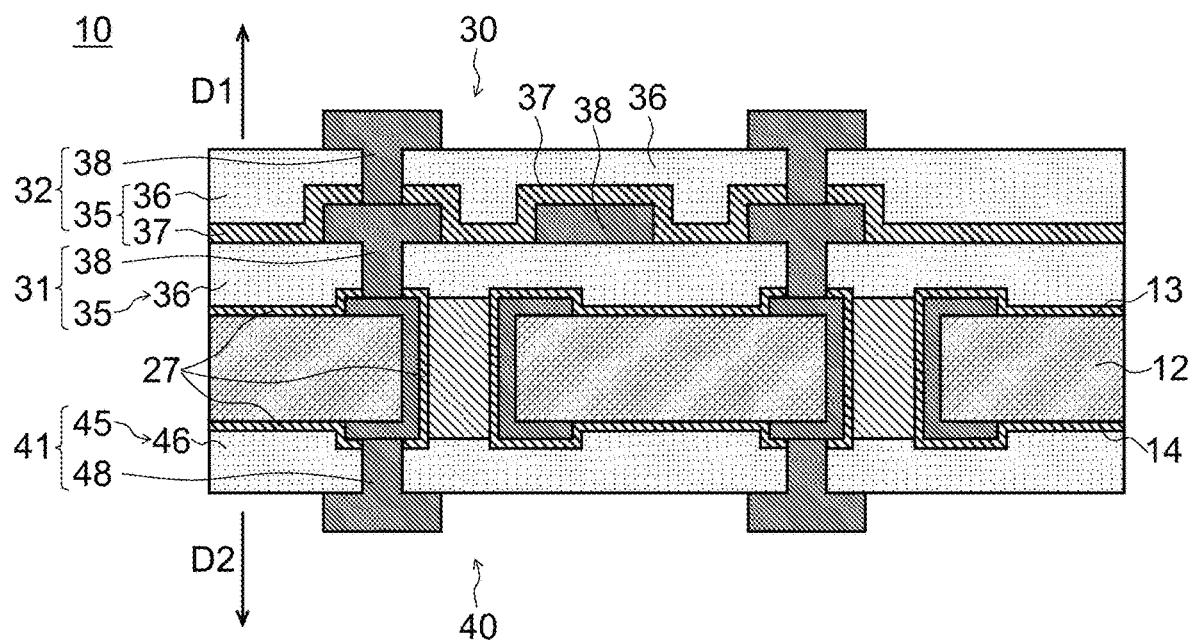
FIG. 45 is a sectional view showing an example of a through electrode substrate according to a sixth modification example of the first embodiment.

FIG. 45 is a sectional view showing the through electrode substrate 10 according to the modification example. The first wiring structure 30 of the through electrode substrate 10 includes the first wiring layer 31 and the second wiring layer 32. Thus, the number of the electroconductive layers 38 included in the first wiring structure 30 is two. On the other hand, the second wiring structure 40 of the through electrode substrate 40 includes the first wiring layer 41. Thus, the number of the electroconductive layers 48 included in the second wiring structure 40 is one.

As shown in FIG. 45, the second wiring layer 32 of the first wiring structure 30 includes the organic layer 36 and the inorganic layer 37. Thus, it can be prevented that the substrate 12 is warped because of the first wiring structure 30. On the other hand, the first wiring layer 41 of the second wiring structure 40 does not include the inorganic layer 47. In addition, the organic layer 46 of the first wiring layer 41 of the second wiring structure 40 includes a portion that is not covered with the inorganic layer 47. For example, as shown in FIG. 45, since the second wiring structure 40 does not include the inorganic layer 47, the organic layer 46 of the first wiring layer 41 is not covered with the inorganic layer 47 from the second side D2.

In the example shown in FIG. 45, the number of the electroconductive layers 48 of the second wiring structure 40 is smaller than the number of the electroconductive layers 38 of the first wiring structure 30. Thus, the number of the organic layers 46 of the second wiring structure 40 is smaller than the number of the organic layers 36 of the first wiring structure 30. Therefore, the degree of warp generated in the second wiring structure 40 caused by the thermal expansion of the organic layer is smaller than the degree of warp generated in the first wiring structure 30. Thus, the impact given to the warp of the substrate 12 as a whole by the fact that the organic layer 46 of the first wiring layer 41 of the second wiring structure 40 includes a portion that is not covered with the inorganic layer 47 from the second side D2 is considered to be insignificant.

Although FIG. 45 shows the example in which the organic layer 46 and the electroconductive layer 48 of the first wiring layer 41 are not at all covered with the inorganic layer 47 from the second side D2, the present invention is not limited thereto. Although not shown, the organic layer 46 and the electroconductive layer 48 of the first wiring layer 41 may be partially covered with the inorganic layer 47 from the second side D2. In the modification example, a ratio of a portion of the organic layer 46 of the first wiring layer 41, which is covered with the inorganic layer 47, is lower than that of the aforementioned case shown in FIG. 25.

In addition, in the modification example, a ratio of a portion of the organic layer 46 of the second wiring structure 40, which is covered with the inorganic layer 47, is lower than a ratio of a portion of the organic layer 36 of the first wiring structure 30, which is covered with the inorganic layer 37. A ratio of a portion of the organic layer 46 of the second wiring structure 40, which is covered with the inorganic layer 47, is not less than 1% and not more than 20%, for example.

A thickness of the inorganic layer 47 of the second wiring structure 40 may be equivalent to a thickness of the inorganic layer 37 of the first wiring structure 30, but may be smaller than the thickness of the inorganic layer 37 of the first wiring structure 30. For example, the thickness of the inorganic layer 47 of the second wiring structure 40 may be at least not less than 30% of the thickness of the inorganic layer 37 of the first wiring structure.

When the organic layer 46 of the first wiring layer 41 of the second wiring structure 40 includes a portion that is not covered with the inorganic layer 47 from the second side D2, it is easy for a gas generated in the through electrode 22 to escape outside the through electrode substrate 10 through the organic layer 46 of the first wiring layer 41. As a result, it can be prevented that the electroconductive layer 48 of the first wiring layer 41 is pushed up or blown off.

Figure 46:
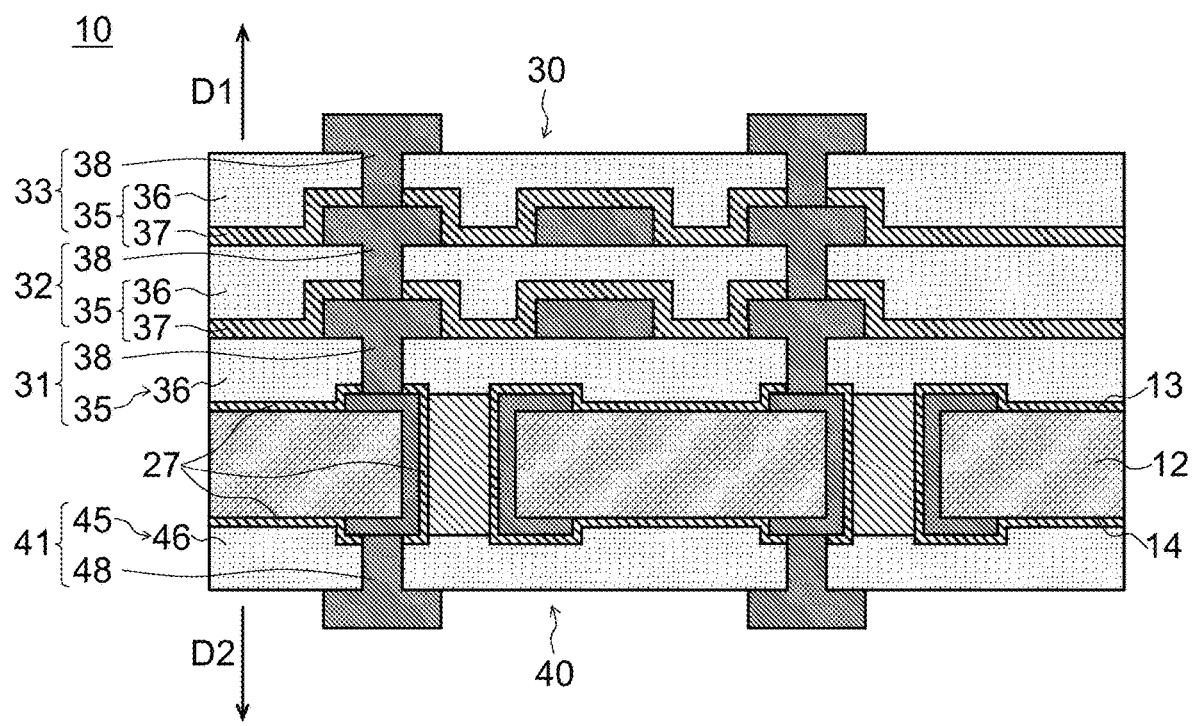
FIG. 46 is a sectional view showing the example of the through electrode substrate according to the sixth modification example of the first embodiment.
Figure 47:
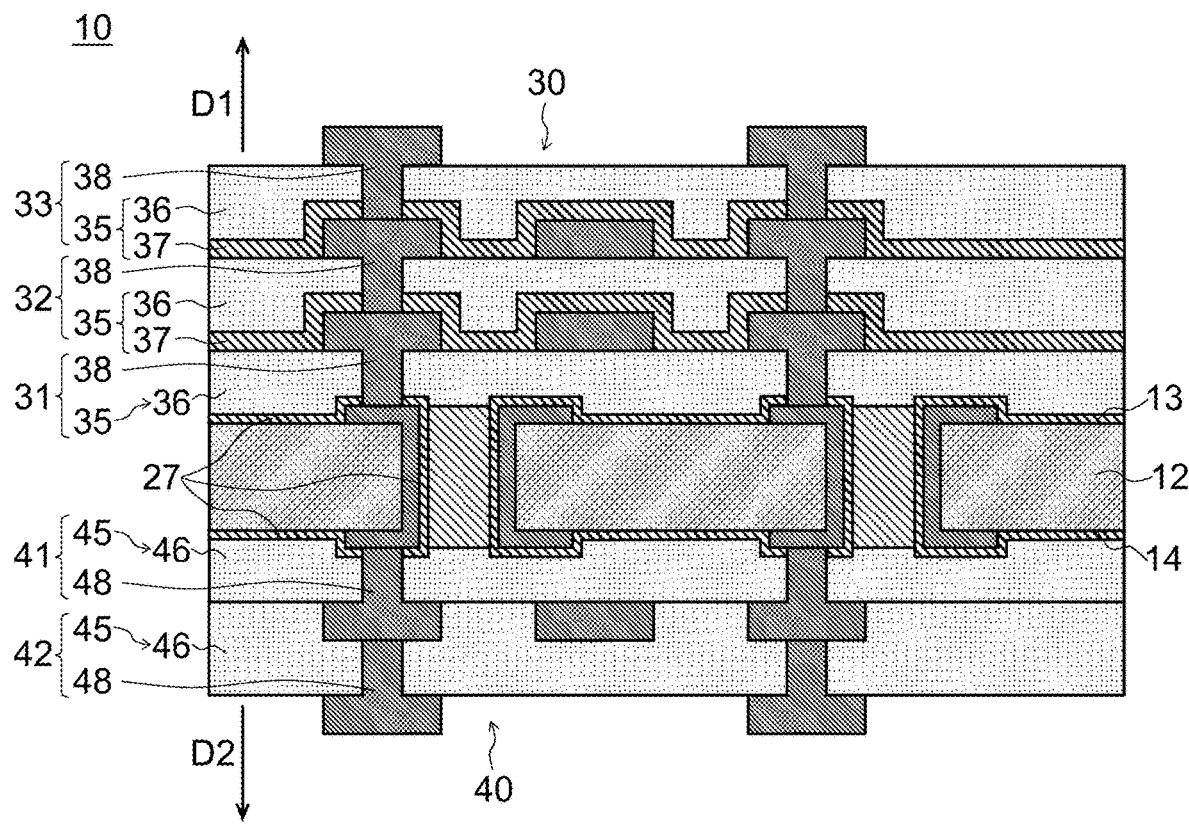
FIG. 47 is a sectional view showing the example of the through electrode substrate according to the sixth modification example of the first embodiment.

In addition, in the example shown in FIG. 45, the number of the electroconductive layers 38 included in the first wiring structure 30 is two, while the number of the electroconductive layers 48 included in the second wiring structure 40 is one. However, as long as the number of the electroconductive layers 38 is larger than the number of the electroconductive layers 48, the specific numbers of the layers are optional. For example, as shown in FIG. 46, the number of the electroconductive layers 38 included in the first wiring structure 30 may be three, and the number of the electroconductive layers 48 included in the second wiring structure 40 may be one. In addition, as shown in FIG. 47, the number of the electroconductive layers 38 included in the first wiring structure 30 may be three, and the number of the electroconductive layers 48 included in the second wiring structure 40 may be two. As shown in FIG. 47, also when the second wiring structure 40 includes a plurality of the organic layers 46, the organic layer 46 of the first wiring layer 41 may not be covered with the inorganic layer 47 from the second side D2. Alternatively, although not shown, the organic layer 46 of the first wiring layer 41 may be partially covered with the inorganic layer 47 from the second side D2, but a ratio of the covered portion may be lower than that of the organic layer 36 of the first wiring structure 30.

Seventh Modification Example

Figure 48:
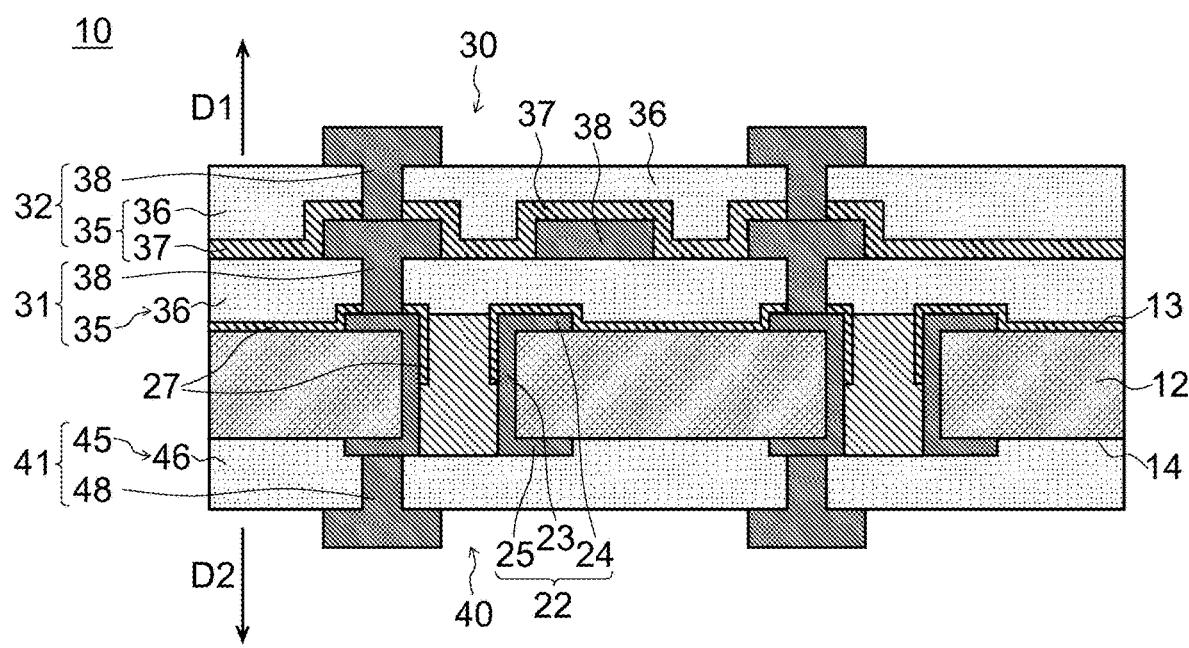
FIG. 48 is a sectional view showing an example of a through electrode substrate according to a seventh modification example of the first embodiment.

In the aforementioned embodiment and the respective modification examples, the inorganic film 27 covers the sidewall portion 23 from an end portion of the sidewall portion 23 on the first side D1 to reach an end portion thereof on the second side D2. However, not limited thereto, as shown in FIG. 48, the inorganic film 27 may not extend up to the end portion of the sidewall portion 23 on the second side D2. For example, the inorganic film 27 may cover a portion of the sidewall portion 23 on the first side D1, but may not cover a portion thereof on the second side D2. In addition, as shown in FIG. 48, the inorganic film 27 may at least partially cover the first portion 24 of the through electrode 22 from the first side D1, but may not cover the second portion 25 of the through electrode 22 from the second side D2. Namely, the second surface 14 of the substrate 12 may not be provided with the inorganic film 27.

Herebelow, advantages of not providing the inorganic film 27 on the side of the second surface 14 are described. As a method of forming the inorganic film 27, a chemical film deposition method such as plasma CVD, or a physical film deposition method such as a vapor deposition method or a sputtering method is used. When the inorganic film 27 is provided on both the first surface 13 and the second surface 14 of the substrate 12, the first surface 13 and the second surface 14 of the substrate 12 are respectively subjected to a film deposition method such as a chemical film deposition method or a physical film deposition method. In the modification example, since the second surface 14 of the substrate 12 is not provided with the inorganic film 27, a film deposition step of the inorganic film 27 on the second surface 14 of the substrate 12 can be omitted. Thus, the number of steps required for manufacturing the second wiring structure 40 can be decreased. As a result, the manufacturing cost of the through electrode substrate 10 can be lowered.

Also in the modification example, similarly to the aforementioned sixth modification example, the number of the electroconductive layers 48 included in the second wiring structure 40 may be smaller than the number of the electroconductive layers 38 included in the first wiring structure 30. In this case, the degree of warp generated in the second wiring structure 40 caused by the thermal expansion of the organic layer is smaller than the degree of warp generated in the first wiring structure 30. Thus, the impact given to the warp of the substrate 12 as a whole by the fact that the second surface 14 of the substrate 12 is not covered with the inorganic film 27 from the second side D2 is considered to be insignificant.

Several modification examples of the aforementioned embodiment have been described above, but it goes without saying that these modification examples can be suitably combined.

Second Embodiment

Next, a second embodiment is described. In the second embodiment, the inorganic film 27 is divided into a first-surface-side inorganic film 27a on the first side D1 and a second-surface-side inorganic film 27b on the second side D2. In the second embodiment, the same part as that of the first embodiment is shown by the same reference number, and detailed description thereof is omitted. In addition, when the effect obtained in the first embodiment is apparently obtained also in this embodiment, description thereof may be omitted.

Figure 26:
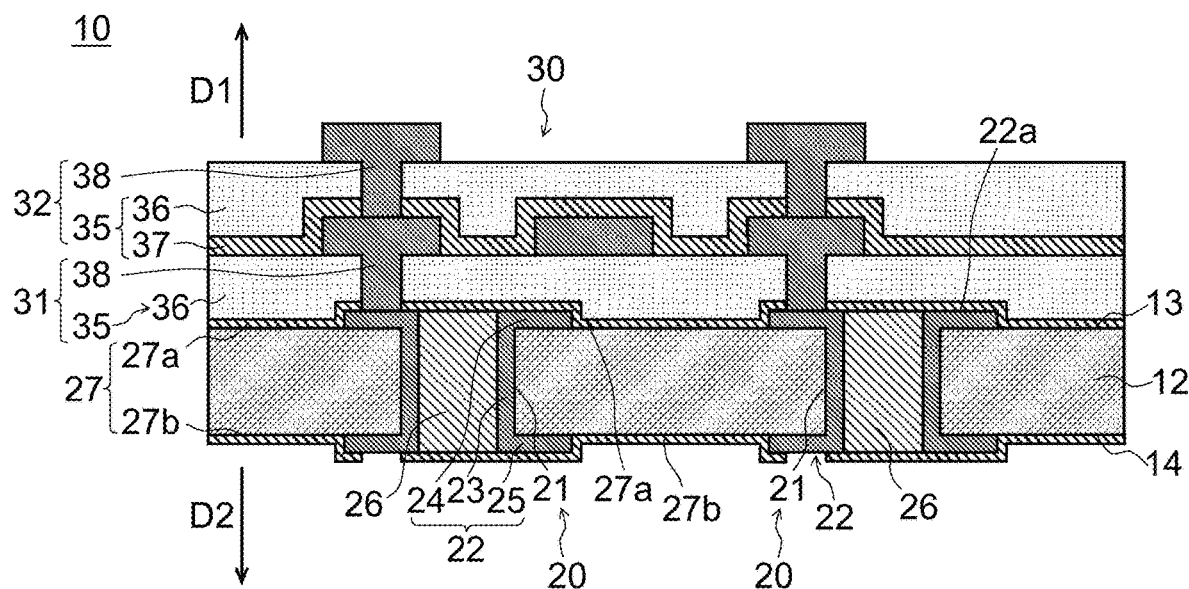
FIG. 26 is a sectional view showing a through electrode substrate according to a second embodiment.
Figure 27:
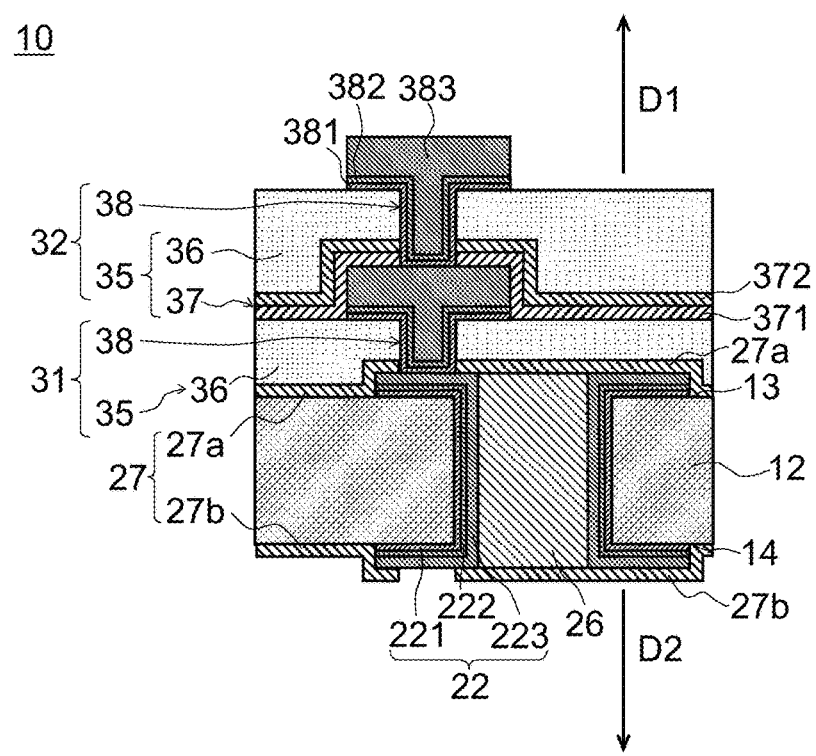
FIG. 27 is an enlarged sectional view of the through electrode substrate of FIG. 26.

FIG. 26 is a sectional view showing a through electrode substrate 10 according to the second embodiment. FIG. 27 is an enlarged sectional view of the through electrode substrate 10 of FIG. 26. The inorganic film 27 includes a first-surface-side inorganic film 27a positioned on the side of the first surface 13 of the substrate 12, and a second-surface-side inorganic film 27b positioned on the side of the second surface 14 of the substrate 12.

The first-surface-side inorganic film 27a at least partially covers the first portion 24 of the through electrode 22 from the first side D1. The first-surface-side inorganic film 27a may further cover an end surface on the first side D1 of the organic film 26 filled in the through hole 20. In addition, the first-surface-side inorganic film 27a may further cover the first surface 13 of the substrate 12.

The second-surface-side inorganic film 27b at least partially covers the second portion 25 of the through electrode 22 from the second side D2. The second-surface-side inorganic film 27b may further cover an end surface on the second side D2 of the organic film 26 filed in the through hole 20. In addition, the second-surface-side inorganic film 27b may further cover the second surface 14 of the substrate 12.

The first-surface-side inorganic film 27a positioned on the first portion 24 of the through electrode 22 is provided with an opening. Through this opening, the electroconductive layer 38 of first wiring layer 31 of the first wiring structure 30 is connected to the first portion 24 of the through electrode 22. Similarly, the second-surface-side inorganic film 27b positioned on the second position 25 of the through electrode 22 may be provided with an opening.

Since thicknesses and layer structures of the first-surface-side inorganic film 27a and the second-surface-side inorganic film 27b, as well as kinds of an inorganic material forming the first-surface-side inorganic film 27a and the second-surface-side inorganic film 27b, are the same as those of the inorganic film 27 in the first embodiment, description thereof is omitted.

(Method of Manufacturing Through Electrode Substrate)

Herebelow, an example of a method of manufacturing the through electrode substrate I10 is described with reference to FIGS. 28 to 33.

Firstly, similarly to the aforementioned first embodiment, the through hole 20 is formed in the substrate 12, and the through electrode 22 is formed in the through hole 20, so as to obtain the substrate 12 shown in FIG. 7.

(Step of Forming Organic Film)

Figure 28:
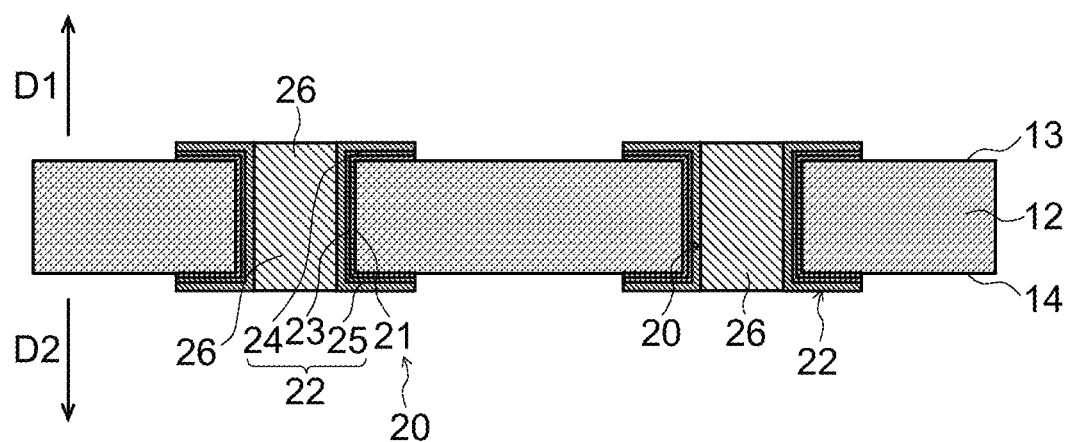
FIG. 28 is a view showing a manufacturing step of the through electrode substrate according to the second embodiment.

Next, as shown in FIG. 28, the through hole 20 is filled with the organic film 26. For example, similarly to the first embodiment, a film including a resin layer for forming the organic film 26 is pressurized so as to push the resin layer into the through hole 20. The resin layer having been pushed into the through hole 20 is cured. Thereafter, an unnecessary portion of the resin layer is removed.

(Step of Forming Inorganic Film)

Figure 29:
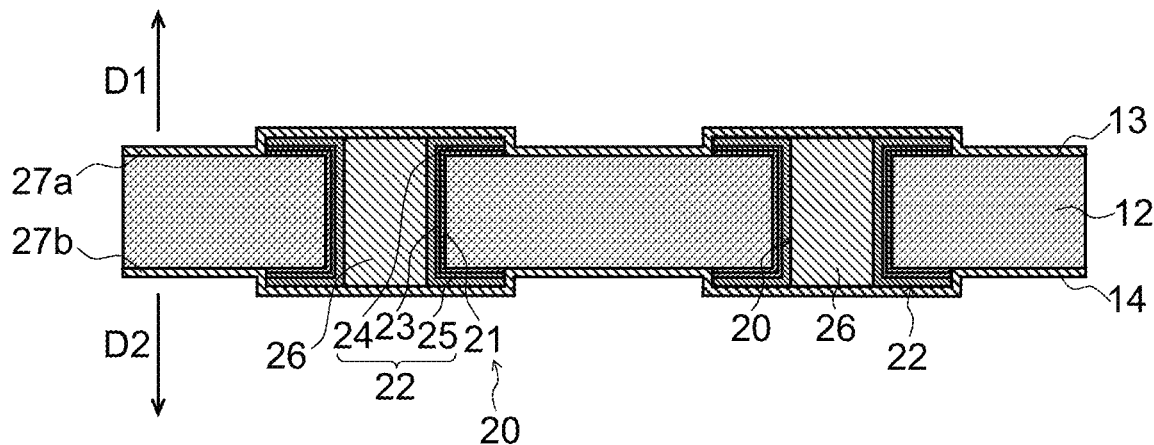
FIG. 29 is a view showing a manufacturing step of the through electrode substrate according to the second embodiment.

Next, as shown in FIG. 29, the first-surface-side inorganic film 27a including a series of films covering the first surface 13 of the substrate 12, the first portion 24 of the through electrode 22 and the end surface of the organic film 26 on the first side D1 is formed by plasma CVD. In addition, the second-surface-side inorganic film 27b including a series of films covering the second surface 14 of the substrate 12, the second portion 25 of the through electrode 22 and the end surface of the organic film 26 on the second side D2 is formed by plasma CVD.

(Step of Forming Organic Layer of First Wiring Structure)

Figure 30:
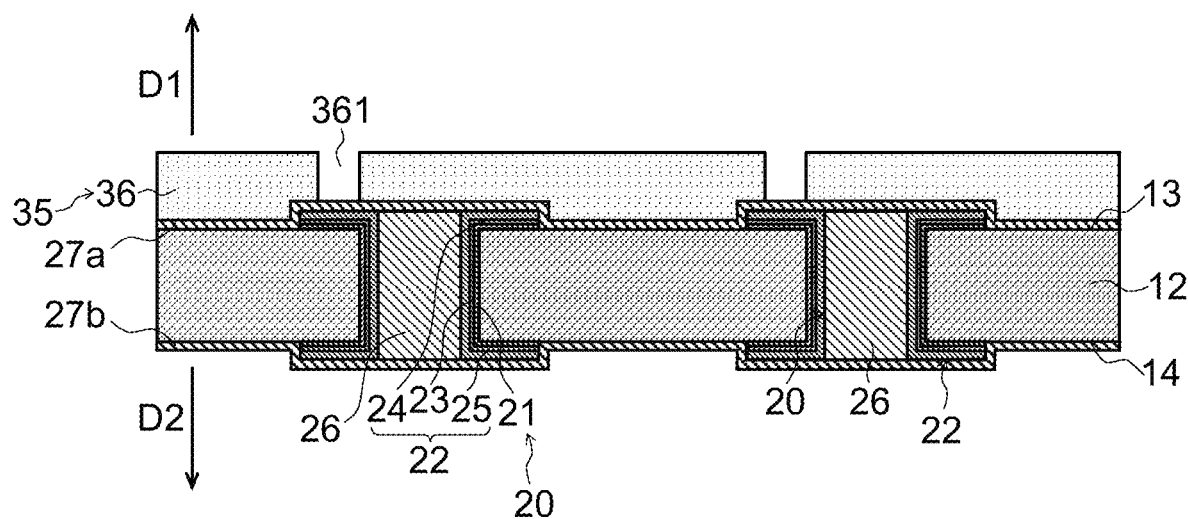
FIG. 30 is a view showing a manufacturing step of the through electrode substrate according to the second embodiment.

Next, as shown in FIG. 30, the organic layer 36 provided with the opening 361 positioned on the first portion 24 of the through electrode 22 is formed. For example, firstly, an organic material such as photosensitive polyimide is deposited on the substrate 12 by a spin coating method, so as to form the organic layer 36. Following thereto, the organic layer 36 is exposed and developed such that a part of the organic layer 36, which corresponds to the opening 361, is removed. Following thereto, the organic layer 36 is baked to cure the organic layer 36. A baking temperature of the organic layer 36 is not less than 200° C., for example.

(Step of Processing Inorganic Layer)

Figure 31:
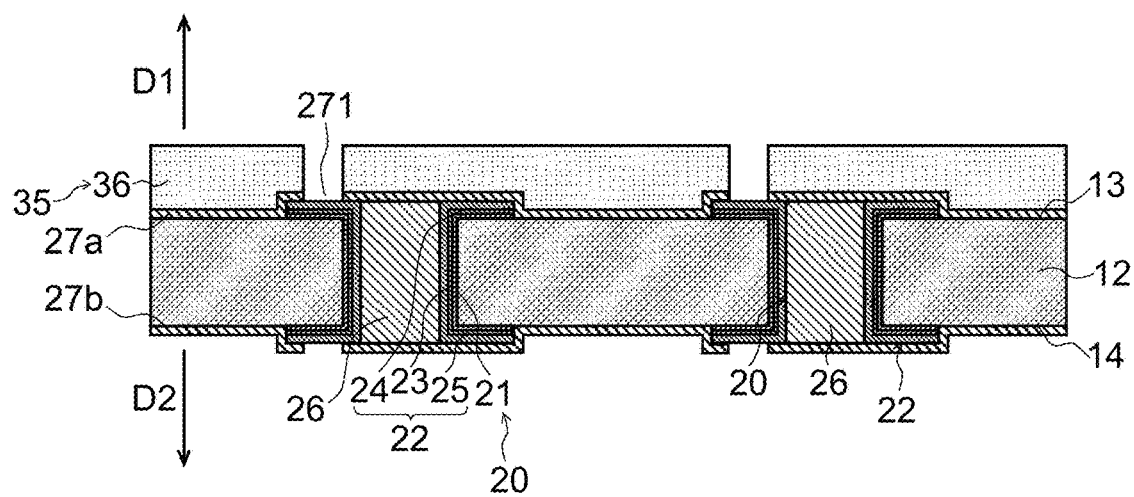
FIG. 31 is a view showing a manufacturing step of the through electrode substrate according to the second embodiment.

Next, the inorganic film 27, which is exposed to the opening 361 of the organic layer 36, is etched by plasma etching, with the organic layer 36 being used as a mask. Thus, as shown in FIG. 31, an opening 271 that communicates with the opening 361 of the organic layer 36 is formed in the inorganic film 27. As an etching gas, a mixed gas of $CF_4$ and $H_2$, a $CHF_3$ gas, a $SF_6$ gas, a $CF_4$ gas, a mixed gas of $CHF_3$ and $O_2$, a mixed gas of $SF_6$ and $O_2$, or a mixed gas of $CF_4$ and $O_2$ may be used, for example. If the surface of the organic layer 36 is damaged by plasma etching, the damaged surface of the organic layer 36 may be removed by thermally processing the organic layer 36. A thermal processing temperature of the organic layer 36 is not less than 200° C., for example.

(Step of Forming Electroconductive Layer of First Wiring Layer)

Figure 32:
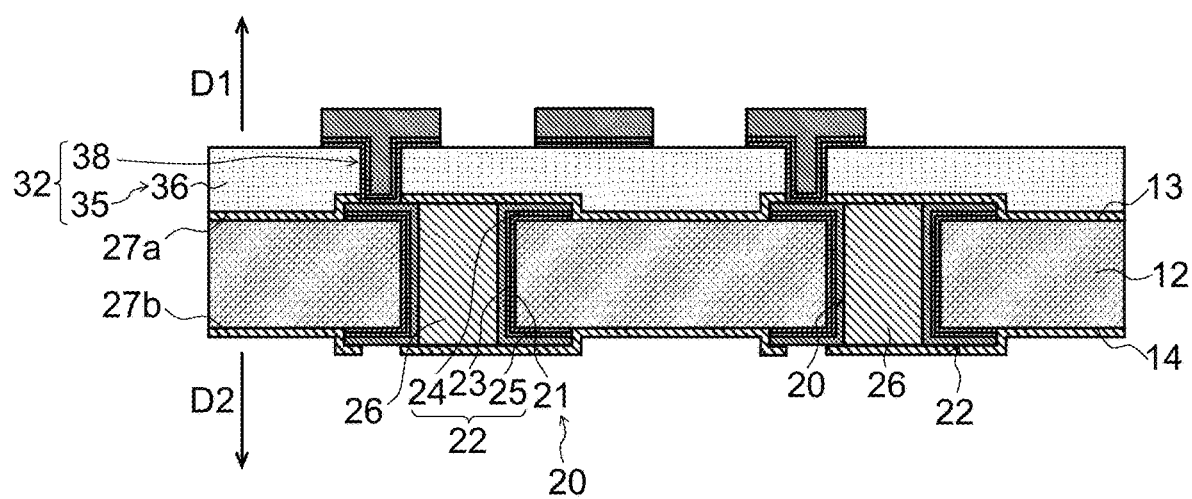
FIG. 32 is a view showing a manufacturing step of the through electrode substrate according to the second embodiment.

Next, as shown in FIG. 32, the electroconductive layer 38, which is connected to the first portion 24 of the through electrode 22 and reaches the first side D1 of the organic layer 36, is formed. In this manner, the first wiring layer 31, which includes the inorganic layer 37 and the electroconductive layer 38, can be formed on the first side D1 of the substrate 12.

(Step of Forming Electroconductive Layer of Second Wiring Layer)

Figure 33:
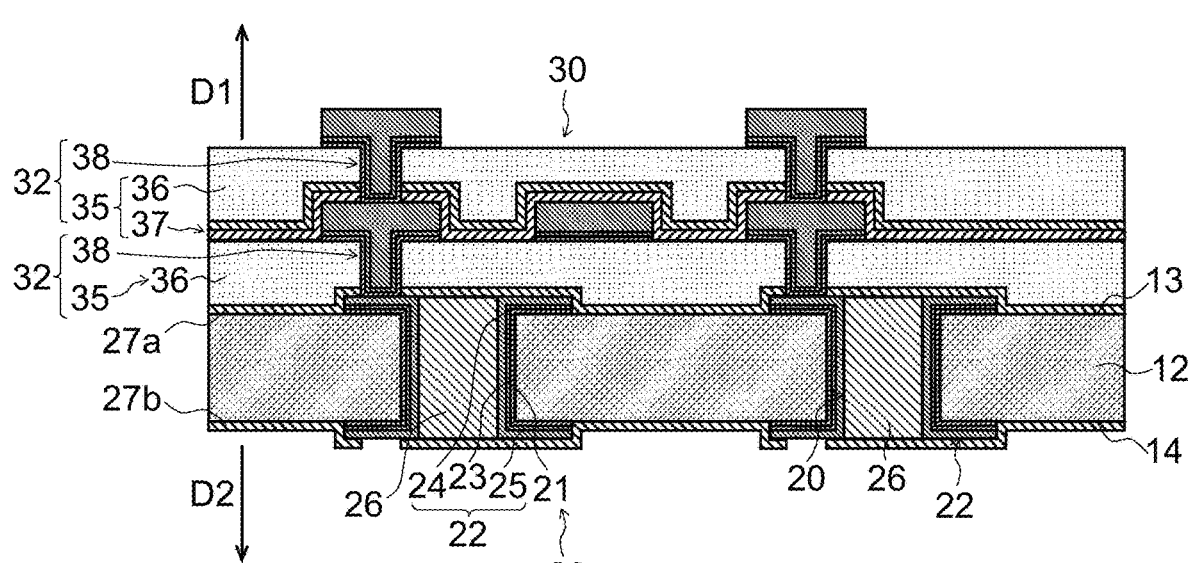
FIG. 33 is a view showing a manufacturing step of the through electrode substrate according to the second embodiment.

Next, similarly to the first wiring layer 31, as shown in FIG. 33, the second wiring layer 32 is formed on the first side D1 of the first wiring layer 31. In this manner, the first wiring structure 30, which includes the first wiring layer 31 and the second wiring layer 32, can be provided on the first side D1 of the substrate 12.

Similarly to the aforementioned first embodiment, also in the through electrode substrate 10 according to the second embodiment, the first-surface-side inorganic film 27a at least partially covers the first portion 24 of the through electrode 22. Thus, a residual stress generated in the first portion 24 of the through electrode 22 can be reduced, whereby it can be prevented that a defect such as a void is formed between the first portion 24 of the through electrode 22 and the electroconductive layer 38 of the first wiring layer 31. In addition, a Young's modulus of an inorganic material forming the first-surface-side inorganic film 27a is high, e.g., not less than 70 GPa. This also contributes the reduction in residual stress generated in the first portion 24 of the through electrode 22. Due to these facts, it can be prevented that electric connection failure occurs between the first portion 24 of the through electrode 22 and the electroconductive layer 38 of the first wiring layer 31.

In addition, since the first-surface-side inorganic film 27a covers the first portion 24 of the through electrode 22, when an atmospheric temperature is high, it can be prevented that atoms, molecules and ions of a metal material, such as copper, forming the first portion 24 of the through electrode 22 diffuse into the organic layer 36 of the insulation layer 35 of the first wiring layer 31. Thus, it can be prevented that the adjacent two electroconductive layers 38 of the first wiring layer 31 communicate with each other, and that the organic layer 36 suffers electric breakdown. In addition, it can be prevented that the thickness of the first portion 24 of the through electrode 22 is decreased by the diffusion of the metal material, resulting in increase in resistance and/or disconnection of the first portion 24.

In addition, similarly to the aforementioned first embodiment, the first-surface-side inorganic film 27a further covers the first surface 13 of the substrate 12. Thus, it can be prevented that a tensile stress is generated in the substrate 12 because of the thermal expansion of the organic layer 36. As a result, it can be prevented that the substrate 12 is warped.

In addition, in this embodiment, the first-surface-side inorganic film 27a further covers the end surface on the first side D1 of the organic film 26 filled in the through hole 20. Thus, when an atmospheric temperature is high, it can be prevented that atoms, molecules and ions of a metal material, such as copper, which diffuse into the organic film 26 from the sidewall portion 23 of the through electrode 22, reach the insulation layer 35 of the first wiring layer 31. Thus, it can be prevented that the adjacent two electroconductive layers 38 of the first wiring layer 31 communicate with each other, and that the organic layer 36 suffers electric breakdown.

The aforementioned second embodiment can be variously modified. Hereunder, modification examples are described with reference to the drawings according to need. In the below description and the drawings for the description, the same part as that of the second embodiment is shown by the same reference number in the second embodiment, and detailed description thereof is omitted. In addition, when the effect obtained in the second embodiment is apparently obtained also in the modification examples, description thereof may be omitted.

First Modification Example

Figure 34:
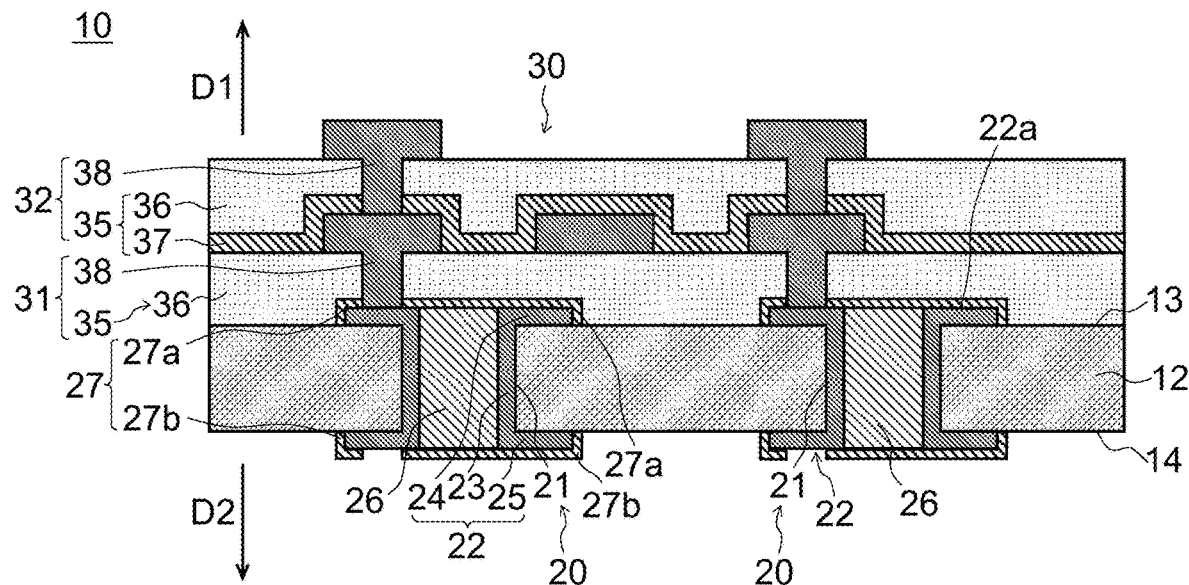
FIG. 34 is a sectional view showing a through electrode substrate according to a first modification example of the second embodiment.

FIG. 34 is a sectional view showing a through electrode substrate 10 according to a first modification example. As shown in FIG. 34, the first-surface-side inorganic film 27a may cover the first portion 24 of the through electrode 22 or the end surface of the organic film 26 on the first side D1, but may not cover the first surface 13 of the substrate 12. For example, the inorganic film 27 may cover the first portion 24 of the through electrode 22 or the end surface of the organic film 26 on the first side D1, but may not cover the first surface 13 of the substrate 12.

Second Modification Example

Figure 35:
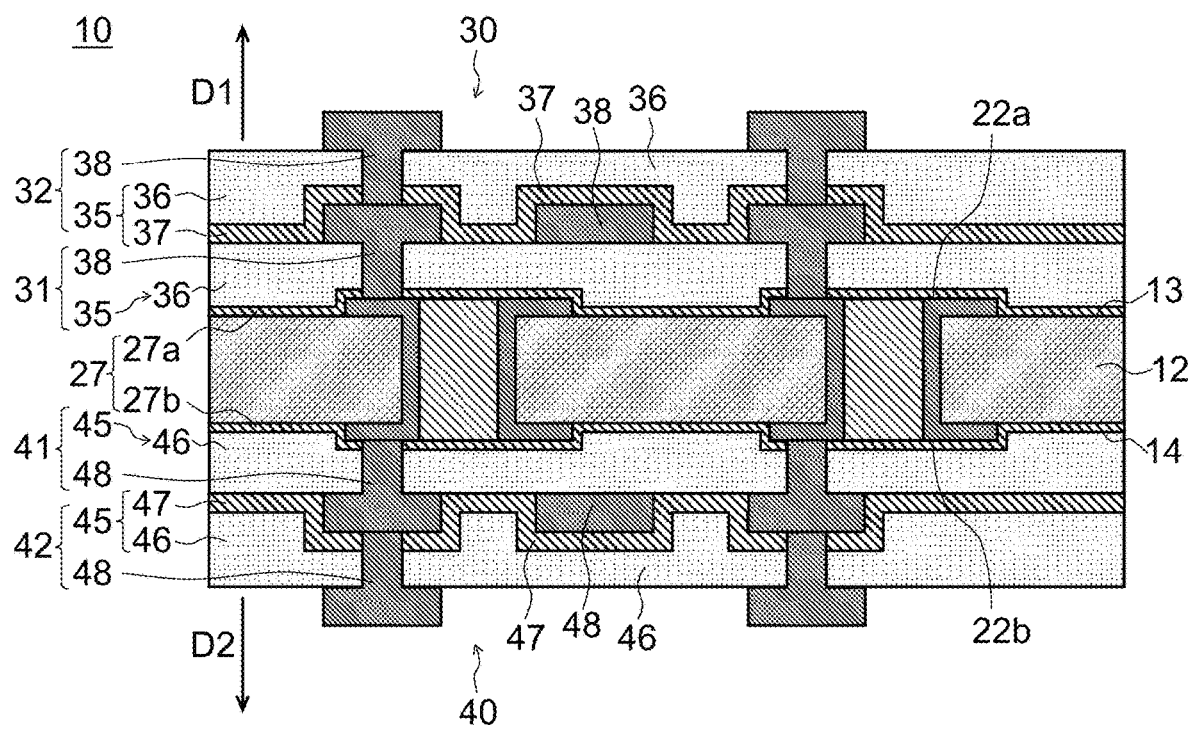
FIG. 35 is a sectional view showing a through electrode substrate according to a second modification example of the second embodiment.

As shown in FIG. 35, the through electrode substrate 10 may further comprise a second wiring structure 40 including at least a first wiring layer 41 positioned on the second surface 14 and a second wiring layer 42 positioned on the first wiring layer 41.

Similarly to the first wiring layer 31 of the first wiring structure 30, the first wiring layer 41 includes an insulation layer 45 and an electroconductive layer 48. The insulation layer 45 is provided with an opening that communicates with the opening of the second-surface-side inorganic film 27b positioned on the second portion 25 of the through electrode 22. The electroconductive layer 48 is connected to the second portion 25 of the through electrode 22 through the opening of the insulation layer 45 and the opening of the second-surface-side inorganic film 27b.

Third Modification Example

In the aforementioned second modification example, the number of the electroconductive layers 38 included in the first wiring structure 30 positioned on the first side D1 of the substrate 12, and the number of the electroconductive layers 48 included in the second wiring structure 40 positioned on the second side D2 of the substrate 12 are the same with each other. However, the number of the electroconductive layers 38 included in the first wiring structure 30 and the number of the electroconductive structures 48 included in the second wiring structure 40 may differ from each other. For example, the number of the electroconductive layers 48 included in the second wiring structure 40 may be smaller than the number of the electroconductive layers 38 included in the first wiring structure 30.

Figure 49:
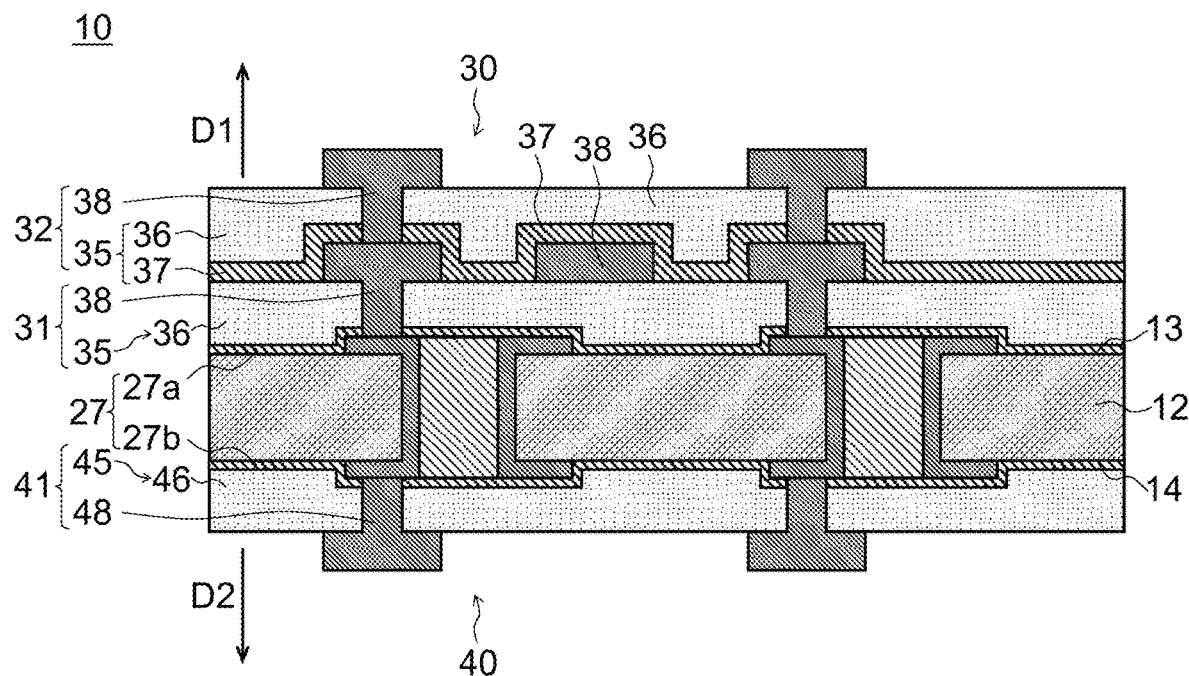
FIG. 49 is a sectional view showing an example of a through electrode substrate according to a third modification example of the second embodiment.

FIG. 49 is a sectional view showing the through electrode substrate 10 according to the modification example. The first wiring structure 30 of the through electrode substrate 10 includes the first wiring layer 31 and the second wiring layer 32. Thus, the number of the electroconductive layers 38 included in the first wiring structure 30 is two. On the other hand, the second wiring structure 40 of the through electrode substrate 40 includes the first wiring layer 41. Thus, the number of the electroconductive layers 48 included in the second wiring structure 40 is one.

As shown in FIG. 49, the second wiring layer 32 of the first wiring structure 30 includes the organic layer 36 and the inorganic layer 37. Thus, it can be prevented that the substrate 12 is warped because of the first wiring structure 30. On the other hand, the first wiring layer 41 of the second wiring structure 40 does not include the inorganic layer 47. In addition, the organic layer 46 of the first wiring layer 41 of the second wiring structure 40 includes a portion that is not covered with the inorganic layer 47. For example, as shown in FIG. 49, since the second wiring structure 40 does not include the inorganic layer 47, the organic layer 46 of the first wiring layer 41 is not covered with the inorganic layer 47 from the second side D2.

In the example shown in FIG. 49, the number of the electroconductive layers 48 of the second wiring structure 40 is smaller than the number of the electroconductive layers 38 of the first wiring structure 30. Thus, the number of the organic layers 46 of the second wiring structure 40 is smaller than the number of the organic layers 36 of the first wiring structure 30. Therefore, the degree of warp generated in the second wiring structure 40 caused by the thermal expansion of the organic layer is smaller than the degree of warp generated in the first wiring structure 30. Thus, the impact given to the warp of the substrate 12 as a whole by the fact that the organic layer 46 of the first wiring layer 41 of the second wiring structure 40 includes a portion that is not covered with the inorganic layer 47 from the second side D2 is considered to be insignificant.

Although FIG. 49 shows the example in which the organic layer 46 and the electroconductive layer 48 of the first wiring layer 41 are not at all covered with the inorganic layer 47 from the second side D2, the present invention is not limited thereto. Although not shown, the organic layer 46 and the electroconductive layer 48 of the first wiring layer 41 may be partially covered with the inorganic layer 47 from the second side D2. In the modification example, a ratio of a portion of the organic layer 46 of the first wiring layer 41, which is covered with the inorganic layer 47, is lower than that of the aforementioned case shown in FIG. 35.

In addition, in the modification example, a ratio of a portion of the organic layer 46 of the second wiring structure 40, which is covered with the inorganic layer 47, is lower than a ratio of a portion of the organic layer 36 of the first wiring structure 30, which is covered with the inorganic layer 37. A ratio of a portion of the organic layer 46 of the second wiring structure 40, which is covered with the inorganic layer 47, is not less than 1% and not more than 20%, for example.

A thickness of the inorganic layer 47 of the second wiring structure 40 may be equivalent to a thickness of the inorganic layer 37 of the first wiring structure 30, but may be smaller than the thickness of the inorganic layer 37 of the first wiring structure 30. For example, the thickness of the inorganic layer 47 of the second wiring structure 40 may be at least not less than 30% of the thickness of the inorganic layer 37 of the first wiring structure.

When the organic layer 46 of the first wiring layer 41 of the second wiring structure 40 includes a portion that is not covered with the inorganic layer 47 from the second side D2, it is easy for a gas generated in the through electrode 22 to escape outside the through electrode substrate 10 through the organic layer 46 of the first wiring layer 41. As a result, it can be prevented that the electroconductive layer 48 of the first wiring layer 41 is pushed up or blown off.

Figure 50:
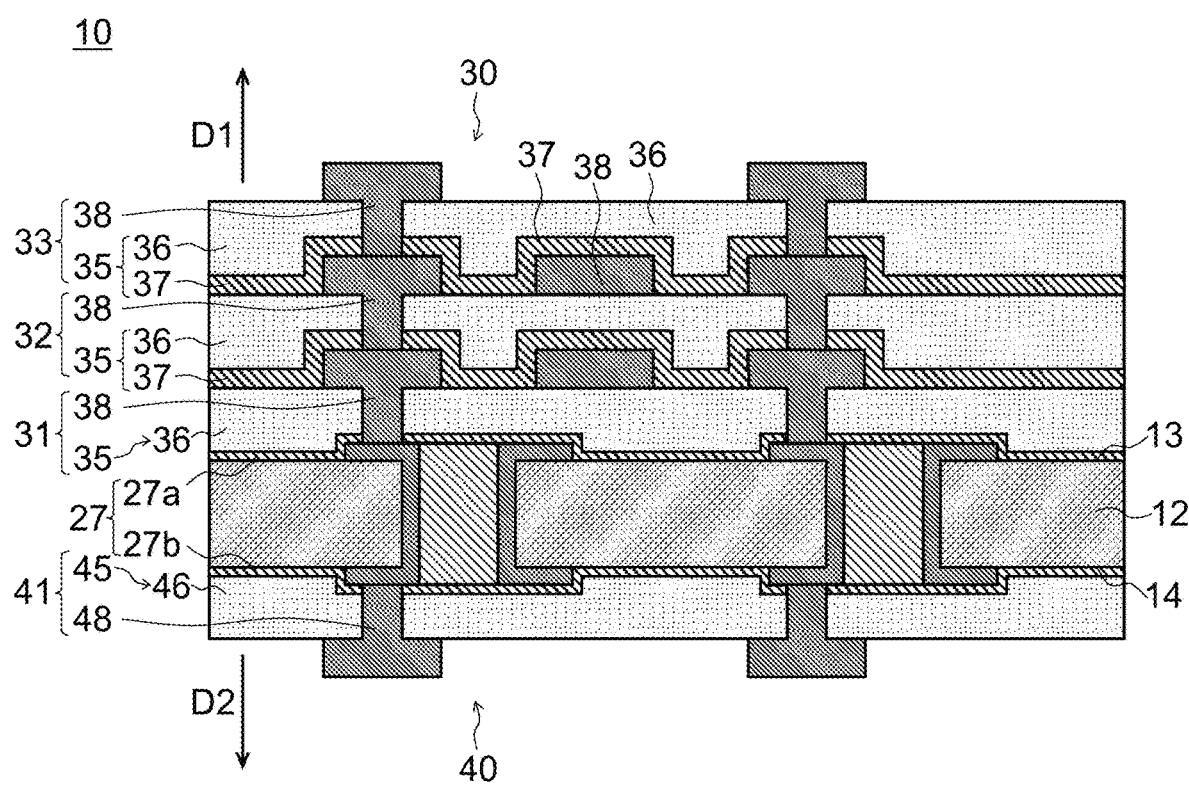
FIG. 50 is a sectional view showing the example of the through electrode substrate according to the third modification example of the second embodiment.
Figure 51:
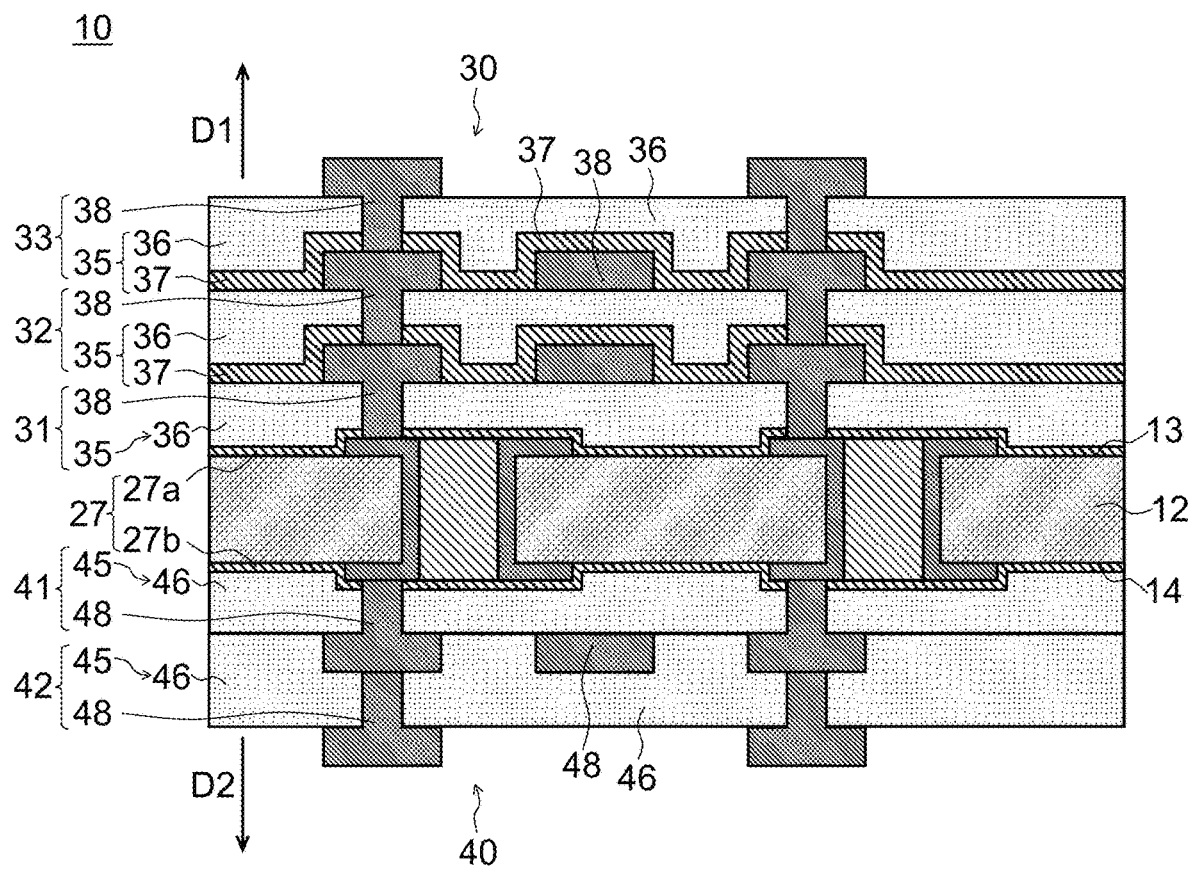
FIG. 51 is a sectional view showing the example of the through electrode substrate according to the third modification example of the second embodiment.
Figure 52:
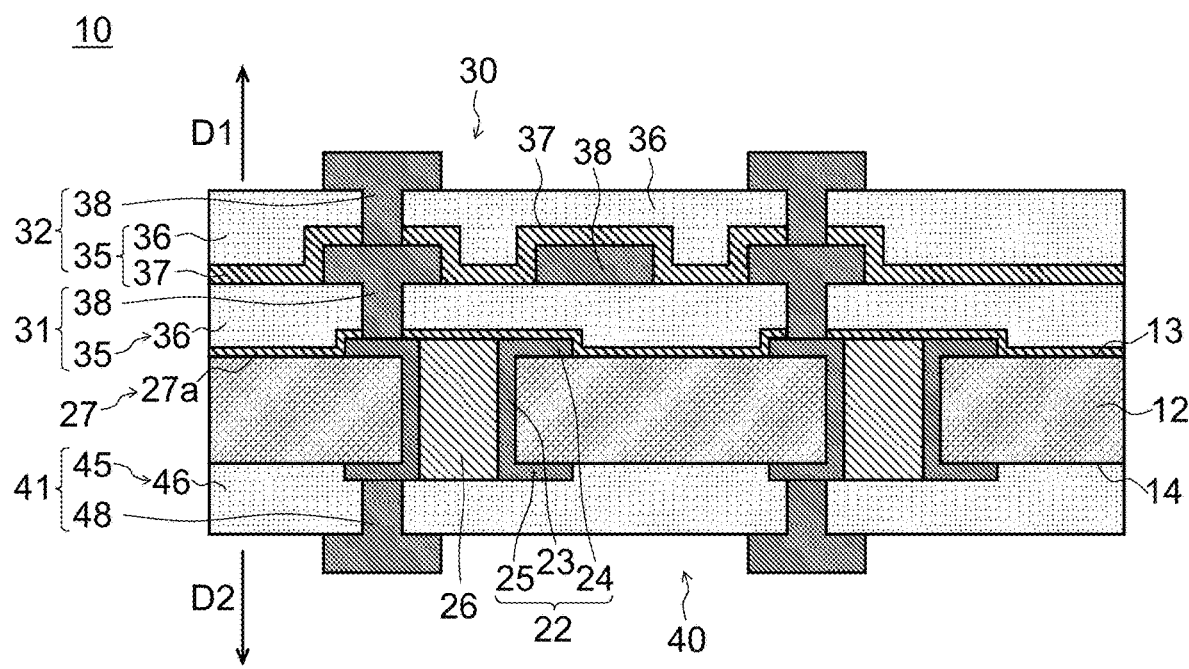
FIG. 52 is a sectional view showing an example of a through electrode substrate according to a fourth modification example of the second embodiment.

In addition, in the example shown in FIG. 49, the number of the electroconductive layers 38 included in the first wiring structure 30 is two, while the number of the electroconductive layers 48 included in the second wiring structure 40 is one. However, as long as the number of the electroconductive layers 38 is larger than the number of the electroconductive layers 48, the specific numbers of the layers are optional. For example, as shown in FIG. 50, the number of the electroconductive layers 38 included in the first wiring structure 30 may be three, and the number of the electroconductive layers 48 included in the second wiring structure 40 may be one. In addition, as shown in FIG. 51, the number of the electroconductive layers 38 included in the first wiring structure 30 may be three, and the number of the electroconductive layers 48 included in the second wiring structure 40 may be two. As shown in FIG. 51, also when the second wiring structure 40 includes a plurality of the organic layers 46, the organic layer 46 of the first wiring layer 41 may not be covered with the inorganic layer 47 from the second side D2. Alternatively, although not shown, the organic layer 46 of the first wiring layer 41 may be partially covered with the inorganic layer 47 from the second side D2, but a ratio of the covered portion may be lower than that of the organic layer 36 of the first wiring structure 30.

Fourth Modification Example

In the aforementioned embodiments and the respective modification examples, the inorganic film 27 includes the first-surface-side inorganic film 27a positioned on the side of the first surface 13 of the substrate 12, and the second-surface-side inorganic film 27b positioned on the side of the second surface 14 of the substrate 12. However, not limited thereto, as shown in FIG. 48, the second portion 25 of the through electrode 22, the end surface of the organic film 26 on the second side D2 and the second surface 14 of the substrate 12 each may include a portion that is not covered with the inorganic film 27. For example, the inorganic film 27 may include the first-surface-side inorganic film 27a, but may not include the second-surface-side inorganic film 27b. Namely, the second surface 14 of the substrate 12 may not be provided with the inorganic film 27.

Also in the modification example, since the second surface 14 of the substrate 12 is not provided with the inorganic film 27, a film deposition step of the inorganic film 27 on the second surface 14 of the substrate 12 can be omitted, similarly to the seventh modification example of the aforementioned first embodiment. Thus, the number of steps required for manufacturing the second wiring structure 40 can be decreased. As a result, the manufacturing cost of the through electrode substrate 10 can be lowered.

In addition, in the modification example, the end surface on the second side D2 of the organic film 26 positioned inside the through hole 20 includes a portion that is not at least partially covered with the inorganic film 27. Thus, it is easy for a gas generated in the through electrode 22 to escape outside the through electrode substrate 10 through the organic layer 46 of the first wiring layer 41. As a result, it can be prevented that the electroconductive layer 48 of the first wiring layer 41 is pushed up or blown off.

Also in the modification example, similarly to the aforementioned third modification example, the number of the electroconductive layers 48 included in the second wiring structure 40 may be smaller than the number of the electroconductive layers 38 included in the first wiring structure 30. In this case, the degree of warp generated in the second wiring structure 40 caused by the thermal expansion of the organic layer is smaller than the degree of warp generated in the first wiring structure 30. Thus, the impact given to the warp of the substrate 12 as a whole by the fact that the second surface 14 of the substrate 12 is not covered with the inorganic film 27 from the second side D2 is considered to be insignificant.

Several modification examples of the aforementioned embodiment have been described above, but it goes without saying that these modification examples can be suitably combined.

Modification Examples of Shape of Through Hole

Figure 36:
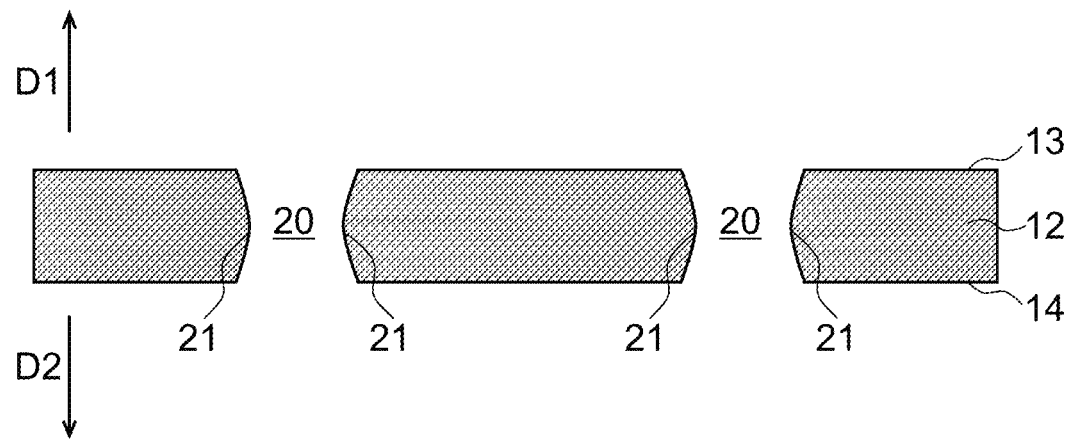
FIG. 36 is a sectional view showing a modification example of a through hole of a substrate.

In the aforementioned respective embodiment, although the through electrode 22 provided in the substrate 12 runs parallel to the direction orthogonal to the normal direction of the first surface 13 of the substrate 12, the shape of the through hole 20 is not specifically limited. For example, as shown in FIG. 36, the through hole 20 may have a shape that narrows between the first surface 13 and the second surface 14. Alternatively, as shown in FIG. 37, the through hole 20 may have a tapered shape in which the size of the through hole 20 decreases from one side of the first surface 13 and the second surface 14 to the other side.

Figure 37:
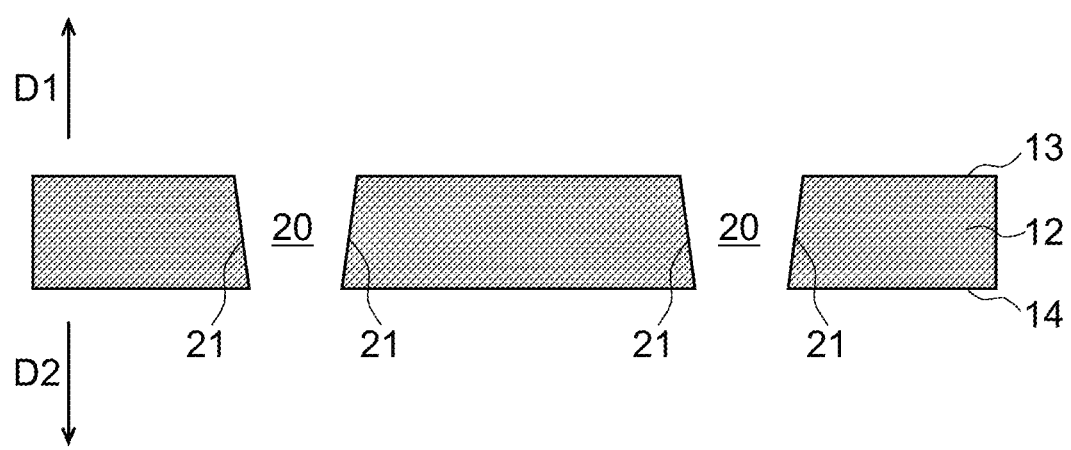
FIG. 37 is a sectional view showing a modification example of a through hole of a substrate.
Figure 38:
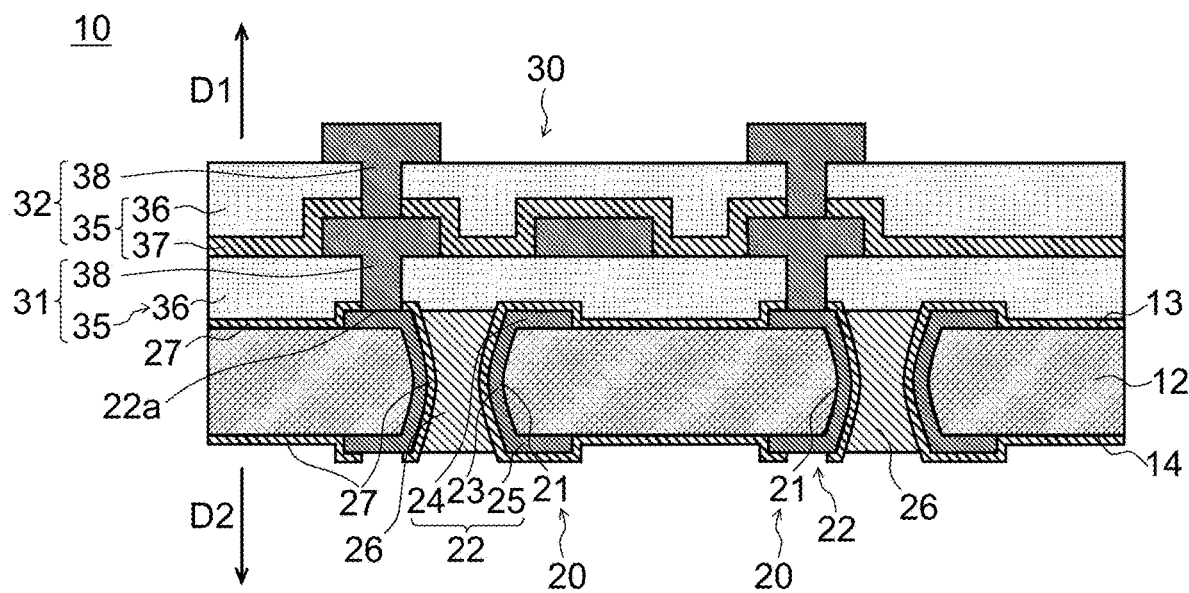
FIG. 38 is a sectional view showing an example of a through electrode substrate comprising the substrate shown in FIG. 36.
Figure 39:
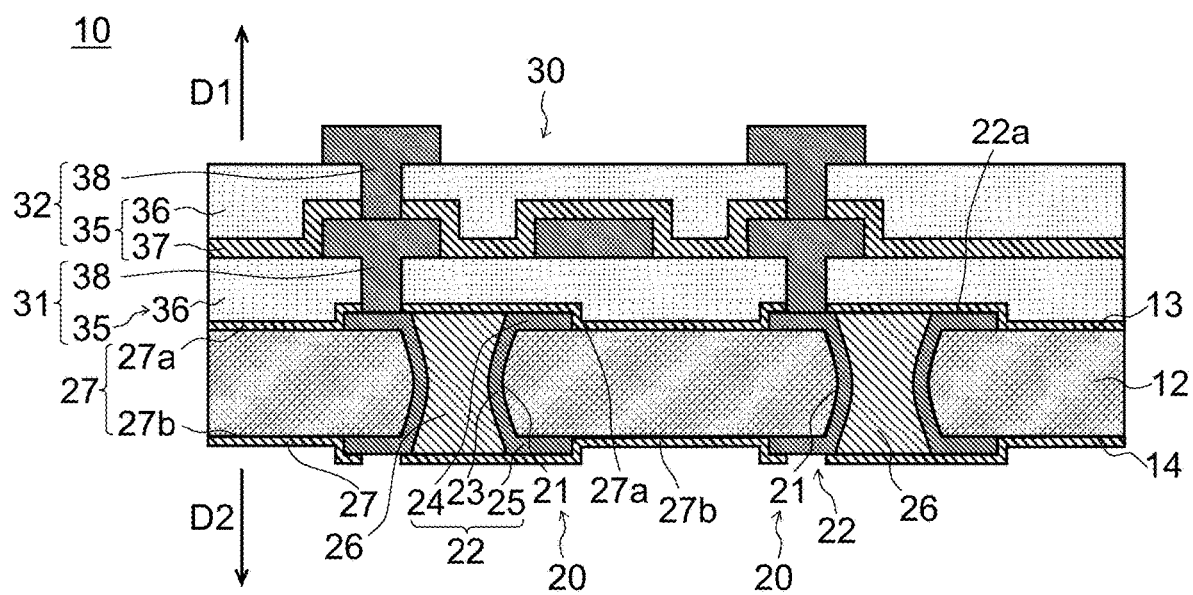
FIG. 39 is a sectional view showing an example of a through electrode substrate comprising the substrate shown in FIG. 36.
Figure 40:
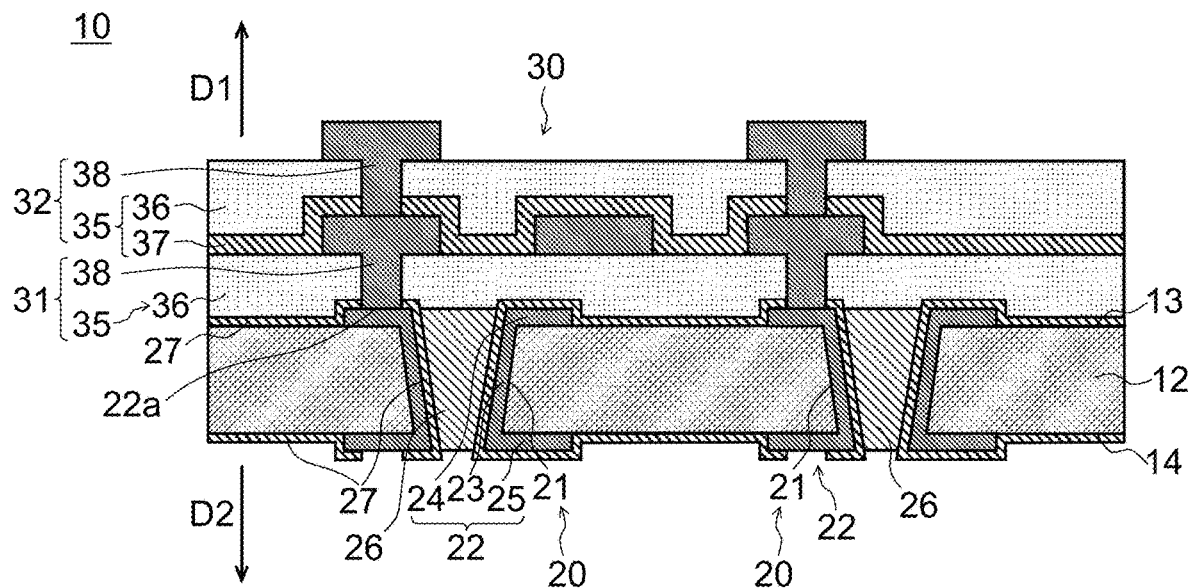
FIG. 40 is a sectional view showing an example of a through electrode substrate comprising the substrate shown in FIG. 37.
Figure 41:
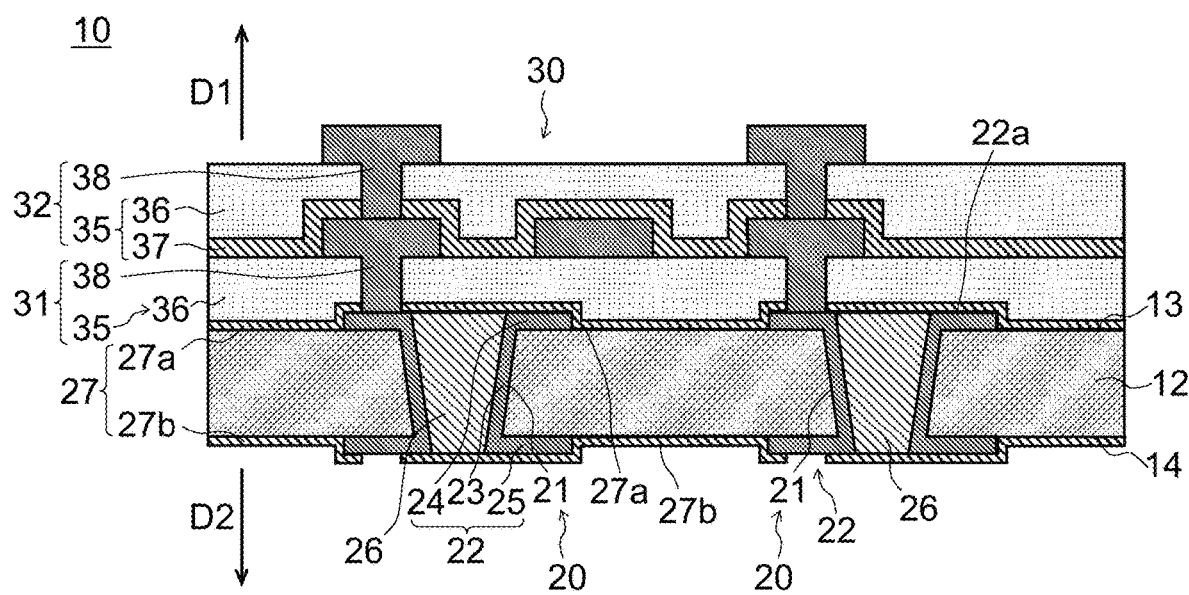
FIG. 41 is a sectional view showing an example of a through electrode substrate comprising the substrate shown in FIG. 37.

The substrate 12 shown in FIG. 36 or 37 may be optionally combined with the through electrode 22, the organic film 26, the inorganic film 27, the first wiring structure 30 and the second wiring structure 40 in the aforementioned respective embodiments. FIG. 38 shows an example in which the substrate 12 shown in FIG. 36, and the through electrode 22, the organic film 26, the inorganic film 27 and the first wiring structure 30 in the first embodiment are combined. In addition, FIG. 39 shows an example in which the substrate 12 shown in FIG. 36, and the through electrode 22, the organic film 26, the first-surface-side inorganic film 27a, the second-surface-side inorganic film 27b and the first wiring structure 30 in the second embodiment are combined. In addition, FIG. 40 shows an example in which the substrate 12 shown in FIG. 37, and the through electrode 22, the organic film 26, the inorganic film 27 and the first wiring structure 30 in the first embodiment are combined. In addition, FIG. 41 shows an example in which the substrate 12 shown in FIG. 37, and the through electrode 22, the organic film 26, the first-surface-side inorganic film 27a, the second-surface-side inorganic film 27b and the first wiring structure 30 in the second embodiment are combined.

Figure 42:
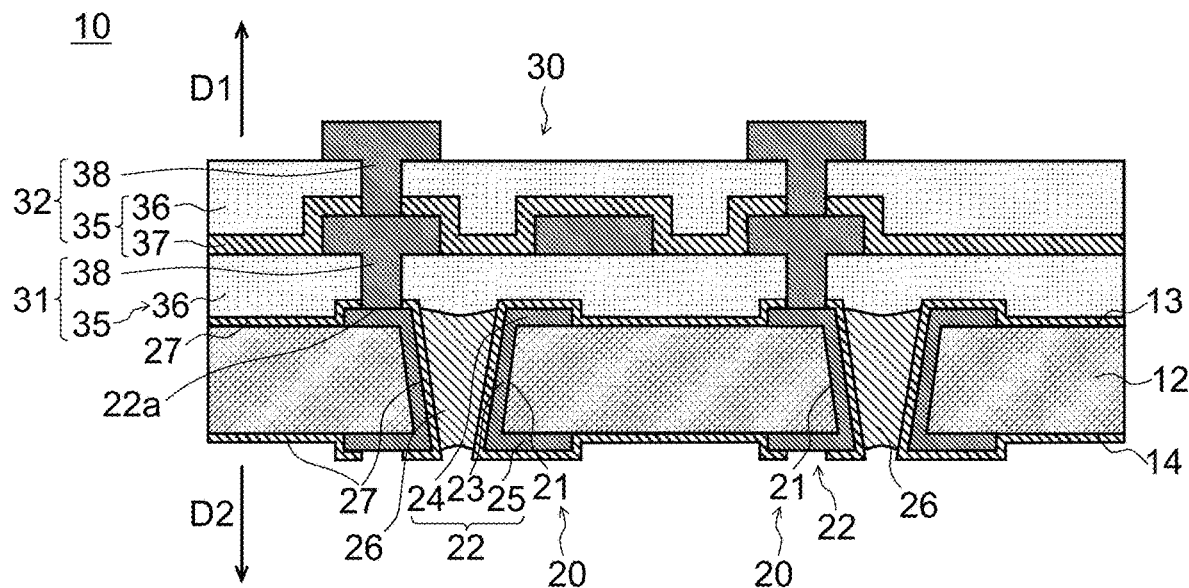
FIG. 42 is a sectional view of a modification example of an organic film filled in a through hole.
Figure 43:
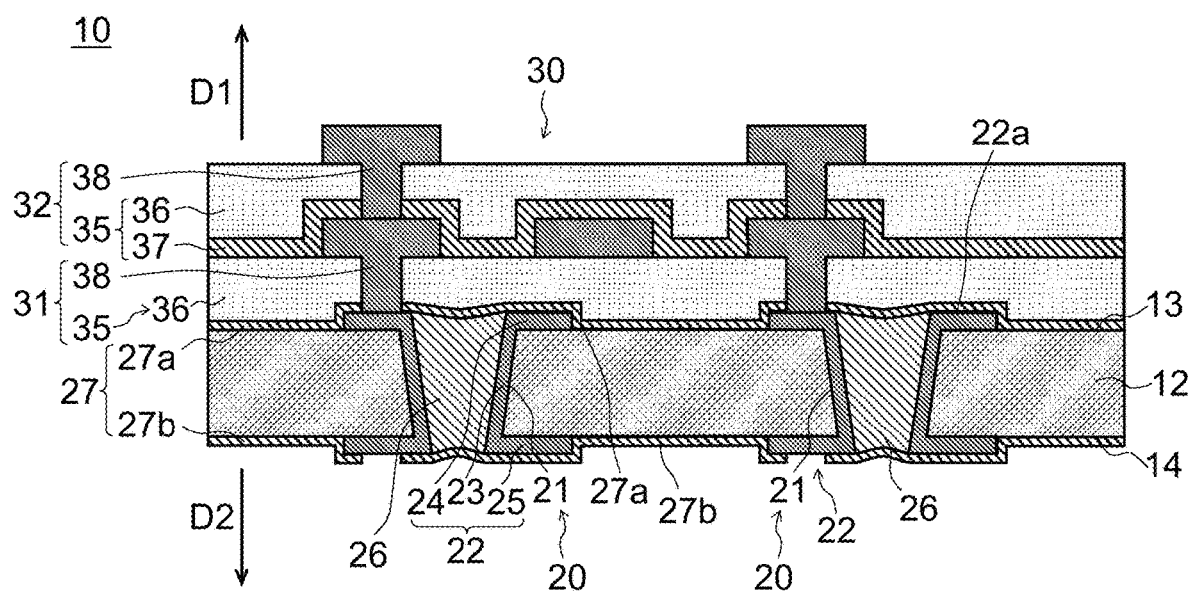
FIG. 43 is a sectional view of a modification example of an organic film filled in a through hole.

In addition, as shown in FIG. 42 or 43, in the through hole 20, there may be a recess or a gap which is not filled with the organic film 26.

Examples of Product on which Through Electrode Substrate is Loaded

Figure 44:
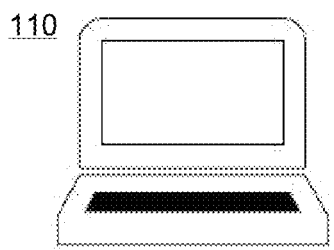
FIG. 44 is a view showing examples of products on which the through electrode substrate is loaded.
Figure 44:
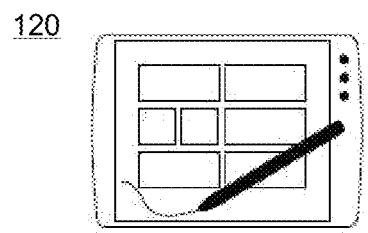
Figure 44:
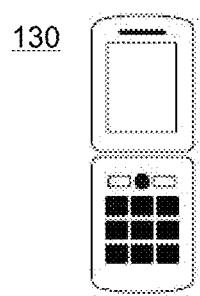
Figure 44:
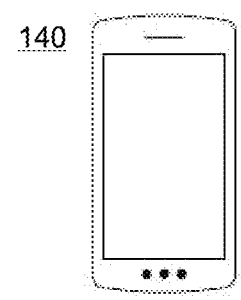
Figure 44:
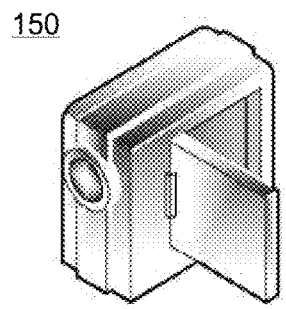
Figure 44:
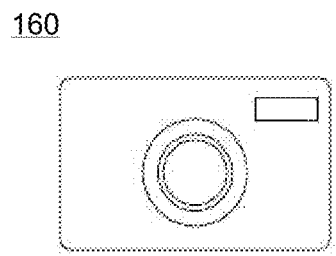
Figure 44:
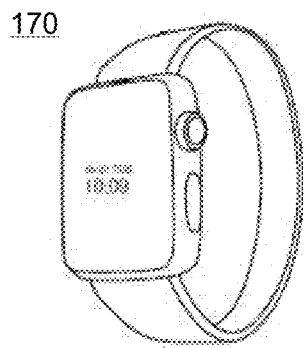
Figure 44:
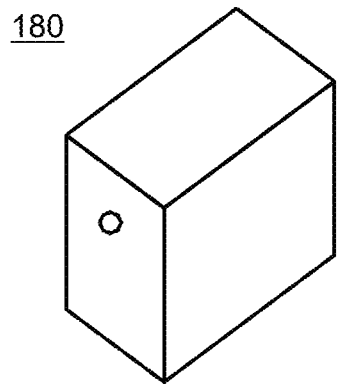

FIG. 44 is a view showing examples on which the through electrode substrate 10 according to the embodiment can be loaded. The through electrode substrate 10 according to the embodiments can be used in various products. For example, the through electrode substrate 10 can be loaded on a note-type personal computer 110, a tablet terminal 120, a mobile phone 130, a smart phone 140, a digital video camera 150, a digital camera 160, a digital watch 170, a server 180 and so on.

10 Through electrode substrate
12 Substrate
13 First surface
14 Second surface
20 Through hole
21 Sidewall
22 Through electrode
22a First end surface
22b Second end surface
221 Barrier layer
222 Seed layer
223 Plated Layer
23 Sidewall portion
24 First portion
25 Second portion
26 Organic film
27 Inorganic film
27a First-surface-side inorganic film
27b Second-surface-side inorganic film
28 Resist layer
29 Resist layer
30 First wiring structure
31 First wiring layer
32 Second wiring layer
35 Insulation layer
36 Organic layer
361 Opening
37 Inorganic layer
371 First inorganic layer
372 Second inorganic layer
373 Opening
38 Electroconductive layer
381 Barrier layer
382 Seed layer
383 Plated layer
39 Resist layer
391 Opening
40 Second wiring structure
41 First wiring layer
42 Second wiring layer
45 Insulation layer
46 Organic layer
47 Inorganic layer
48 Electroconductive layer
60 Mounting substrate
61 Element
62 Terminal
D1 First side
D2 Second side

What is claimed is:

1. A method of manufacturing a through electrode substrate comprising:
a step of preparing a substrate including a first surface positioned on a first side, and a second surface positioned on a second side opposite to the first side, the substrate being provided with a through hole;
a step of forming a through electrode having a sidewall portion extending along a sidewall of the through hole, and a first portion positioned on the first surface of the substrate and connected to the sidewall portion;
a step of forming an organic film inside the through hole;
a step of forming an inorganic film at least partially covering the first portion of the through electrode from the first side;
a step of forming an insulation layer positioned to the first side of the inorganic film; and
a step of forming an electroconductive layer passing through the inorganic film and the insulation layer so as to be connected to the first portion of the through electrode.

2. The method of manufacturing a through electrode substrate according to claim 1, wherein
the inorganic film at least partially covers the sidewall portion of the thorough electrode.

3. The method of manufacturing a through electrode substrate according to claim 1, wherein;
the step of forming the through electrode further forms a second portion positioned on the second surface of the substrate and connected to the sidewall portion; and
the inorganic film at least partially covers the second portion of the through electrode from the second side.

4. The method of manufacturing a through electrode substrate according to claim 1, wherein
the inorganic film at least partially covers an end surface of the organic film on the first side.

5. The method of manufacturing a through electrode substrate according to claim 1, wherein:
the step of forming the through electrode further forms a second portion positioned on the second surface of the substrate and connected to the sidewall portion; and
the method of manufacturing a through electrode substrate further comprises a step of forming a second-surface-side inorganic film at least partially covering the second portion of the through electrode from the second side.

6. The method of manufacturing a through electrode substrate according to claim 5, wherein
the second-surface-side inorganic film at least partially covers an end surface of the organic film on the second side.

7. The method of manufacturing a through electrode substrate according to claim 1, wherein
the insulation layer and the electroconductive layer constitutes a first wiring layer;
the method comprises a step of forming a second wiring layer on the first wiring layer;
the second wiring layer has an insulation layer provided with an opening positioned on the electroconductive layer of the first wiring layer, and an electroconductive layer connected to the electroconductive layer of the first wiring layer through the opening of the insulation layer; and
the insulation layer of the second wiring layer includes an inorganic layer at least partially covering the electroconductive layer of the first wiring layer from the first side.

8. The method of manufacturing a through electrode substrate according to claim 1, wherein:
the step of forming the through electrode further forms a second portion positioned on the second surface of the substrate and connected to the sidewall portion; and
the method comprises a step of forming a second wiring structure including at least a first wiring layer positioned on the second surface of the substrate; and
the first wiring layer of the second wiring structure has an insulation layer provided with an opening positioned on the second portion of the through electrode, and an electroconductive layer connected to the second portion of the through electrode through the opening of the insulation layer.

9. The method of manufacturing a through electrode substrate according to claim 8, wherein:
the number of electroconductive layers included in the second wiring structure is smaller than the number of electroconductive layers positioned on the first side of the substrate; and
the organic layer of the first wiring layer of the second wiring structure includes a portion that is not covered with an inorganic layer having insulation properties.

10. The method of manufacturing a through electrode substrate according to claim 8, wherein:
the number of electroconductive layers included in the second wiring structure is smaller than the number of electroconductive layers positioned on the first side of the substrate; and
the inorganic film partially covers the sidewall portion such that the inorganic film does not extend up to an end portion on the second side of the sidewall portion of the through electrode.

11. The method of manufacturing a through electrode substrate according to claim 8, wherein:
the number of electroconductive layers included in the second wiring structure is smaller than the number of electroconductive layers positioned on the first side of the substrate; and
an end surface of the organic film on the second side at least partially includes a portion that is not covered with an inorganic film having insulation properties.

12. The method of manufacturing a through electrode substrate according to claim 1, wherein
the inorganic film includes at least silicon oxide or silicon nitride.

* * * * *